(12) United States Patent
Tan et al.

(10) Patent No.: US 11,282,972 B2
(45) Date of Patent: Mar. 22, 2022

(54) CRYSTALLINE MATERIAL, PHOTOTRANSISTOR, AND METHODS OF FABRICATION THEREOF

(71) Applicant: NATIONAL UNIVERSITY OF SINGAPORE, Singapore (SG)

(72) Inventors: Wee Chong Tan, Singapore (SG); Kah-Wee Ang, Singapore (SG)

(73) Assignee: NATIONAL UNIVERSITY OF SINGAPORE, Singapore (SG)

( * ) Notice: Subject to any disclaimer, the term of this patent is extended or adjusted under 35 U.S.C. 154(b) by 53 days.

(21) Appl. No.: 16/499,422

(22) PCT Filed: Mar. 28, 2018

(86) PCT No.: PCT/SG2018/050145
§ 371 (c)(1),
(2) Date: Sep. 30, 2019

(87) PCT Pub. No.: WO2018/182517
PCT Pub. Date: Oct. 4, 2018

(65) Prior Publication Data
US 2021/0098639 A1  Apr. 1, 2021

Related U.S. Application Data

(60) Provisional application No. 62/478,640, filed on Mar. 30, 2017, provisional application No. 62/590,386, filed on Nov. 24, 2017.

(51) Int. Cl.
*H01L 29/10* (2006.01)
*H01L 31/0312* (2006.01)
*C01B 32/914* (2017.01)
*C01B 25/08* (2006.01)
*H01L 31/113* (2006.01)

(52) U.S. Cl.
CPC ........ *H01L 31/03125* (2013.01); *C01B 25/08* (2013.01); *C01B 32/914* (2017.08); *H01L 31/1136* (2013.01)

(58) Field of Classification Search
CPC ......... H01L 21/02392; H01L 31/03125; H01L 31/1136; H01L 29/1054; C01B 25/08; C01B 32/914
See application file for complete search history.

(56) References Cited

U.S. PATENT DOCUMENTS

2008/0038626 A1* 2/2008 Park .................... C01B 25/02
429/50
2017/0207348 A1* 7/2017 Yeo .................... H01L 29/785
(Continued)

FOREIGN PATENT DOCUMENTS

CN     106315531 A     1/2017

OTHER PUBLICATIONS

Li, Ling & Engel, Michael & Farmer, Damon & Han, Shu-Jen & Wong, H-S. (2016). High Performance P-type Black Phosphorus Transistor with Scandium Contact. ACS nano. 10. 10.1021/acsnano. 6b01008.*

(Continued)

*Primary Examiner* — Bitew A Dinke
(74) *Attorney, Agent, or Firm* — Volpe Koenig

(57) ABSTRACT

Crystalline material, phototransistor, and methods of fabrication thereof. The crystalline material comprising a plurality of stacked two-dimensional black phosphorous carbide layers.

20 Claims, 25 Drawing Sheets

(56) References Cited

U.S. PATENT DOCUMENTS

| | | | |
|---|---|---|---|
| 2018/0012962 A1* | 1/2018 | Yeh | H01L 29/66969 |
| 2018/0151751 A1* | 5/2018 | Yeh | H01L 29/24 |
| 2018/0308684 A1* | 10/2018 | Thomas | H01L 21/0254 |
| 2019/0296178 A1* | 9/2019 | Bessonov | H01L 31/1136 |
| 2019/0308880 A1* | 10/2019 | Tour | H01G 11/32 |
| 2020/0019656 A1* | 1/2020 | Narayanan | G06F 9/451 |
| 2021/0063372 A1* | 3/2021 | Mannari | G01N 33/0073 |

OTHER PUBLICATIONS

Na, J., Lee, Y. T., Lim, J. A., Hwang, D. K., Kim, G. T., Choi, W. K., & Song, Y. W. (2014). Few-layer black phosphorus field-effect transistors with reduced current fluctuation. ACS nano, 8(11), 11753-11762. https://doi.org/10.1021/nn5052376.*

Kim, JS., Liu, Y., Zhu, W. et al. Toward air-stable multilayer phosphorene thin-films and transistors. Sci Rep 5, 8989 (2015). https://doi.org/10.1038/srep08989.*

C. R. Ryder, J. D. Wood, S. A. Wells, Y. Yang, D. Jariwala, T. J. Marks, G. C. Schatz, and M. C. Hersam, "Covalent functionalization and passivation of exfoliated black phosphorus via aryl diazonium chemistry," Nature Chemistry, 8, 597 (2016). DOI:10.1038/nchem. 2505.*

Xiang, D., Han, C., Wu, J. et al. Surface transfer doping induced effective modulation on ambipolar characteristics of few-layer black phosphorus. Nat Commun 6, 6485 (2015). https://doi.org/10.1038/ncomms7485.*

Prakash, A., Cai, Y., Zhang, G., Zhang, Y. W., & Ang, K. W. (2017). Black Phosphorus N-Type Field-Effect Transistor with Ultrahigh Electron Mobility via Aluminum Adatoms Doping. Small (Weinheim an der Bergstrasse, Germany), 13(5), 10.1002/smll.201602909. https://doi.org/10.1002/smll.201602909.*

Guan J, Liu D, Zhu Z, Tománek D. Two-Dimensional Phosphorus Carbide: Competition between sp(2) and sp(3) Bonding. Nano Letters. May 2016;16(5):3247-3252. DOI: 10.1021/acs.nanolett. 6b00767.*

Wang, G., Bao, L., Pei, T., Ma, R., Zhang, Y., Sun, L., Zhang, G., Yang, H., Li, J., Gu, C., Du, S., Pantelides, S., Schrimpf, R., & Gao, H. (2016). Introduction of Interfacial Charges to Black Phosphorus for a Family of Planar Devices. Nano letters, 16 11, 6870-6878.*

Guo, Q., Pospischil, A., Bhuiyan, M., Jiang, H., Tian, H., Farmer, D., Deng, B., Li, C., Han, S. J., Wang, H., Xia, Q., Ma, T. P., Mueller, T., & Xia, F. (2016). Black Phosphorus Mid-Infrared Photodetectors with High Gain. Nano letters, 16(7), 4648-4655. https://doi.org/10.1021/acs.nanolett.6b01977.*

Liu, Y., Cai, Y., Zhang, G., Zhang, Y., & Ang, K. (2017). Al-Doped Black Phosphorus p—n Homojunction Diode for High Performance Photovoltaic. Advanced Functional Materials, 27, 1604638.*

Liu, Han & Neal, Adam & Zhu, Zhen & Luo, Zhe & Xu, Xianfan & Tomanek, David & Ye, Peide. (2014). Phosphorene: An Unexplored 2D Semiconductor with a High Hole Mobility.*

Zhu, H., McDonnell, S., Qin, X., Azcatl, A., Cheng, L., Addou, R., Kim, J., Ye, P. D., & Wallace, R. M. (2015). Al2O3 on Black Phosphorus by Atomic Layer Deposition: An in Situ Interface Study. ACS applied materials & interfaces, 7(23), 13038-13043. https://doi.org/10.1021/acsami.5b03192.*

Allain, A., et al. "Electiical contacts to two-dimensional Semiconductors" Kis, Nat Mater 2015, 14, 1195.

Balandin, A.A. "Low-frequency 1/f noise in graphene devices" Nat. Nanotechnol. 2013, 8, 549.

Buscema, M., et al. "Photocurrent generation with two-dimensional van der Waals semiconductors" Chem. Soc. Rev. 2015, 44, 3691.

Claeyssens, F., et al. "Phosphorus carbides: theory and experiment" Dalton Transactions 2004, 3085.

Das, S., et al. "Ambipolar Phosphorene Field Effect Transistor"ACS Nano 2014, 8, 11730.

Du, Y., et al. "Device Perspective for Black Phosphorus Field-Effect Transistors: Contact Resistance, Ambipolar Behavior, and Scaling" ACS Nano 2014, 8, 10035.

Du, Y., et al. "Performance Enhancement of Black Phosphorus Field-Effect Transistors by Chemical Doping" IEEE Electron Device Letters 2016, 37, 429.

Ghibaudo, G. Electronics Letters 1988, 24, 543.

Goodman, N.B., et al. "Valence-band structures of phosphorus allotropes" Physical Review B 1983, 27, 7440.

Gow, T.R., et al. "Decomposition of Trimethylaluminum on Si(100)" Chemistry of Materials 1989, 1, 406.

Guan, J., et al. "Two-Dimensional Phosphorus Carbide: Competition between sp2 and sp3 Bonding" Nano Lett. Apr. 18, 2016, vol. 16, pp. 3247-3252 [Retrieved on Jun. 13, 2018]<DOI:10.1021/ACS. NANOLETT.6B00767>Whole document.

Guo, Q., et al. "Black Phosphorus Mid-Infrared Photodetectors with High Grain" Nano Lett. 2016, 16, 4648.

Guo, Z., et al. "From Black Phosphorus to Phosphorene: Basic Solvent Exfoliation, Evolution of Raman Scattering, and Applications to Ultrafast Photonics" Advanced Functional Materials 2015, 25, 6996.

Hamamatsu, K.K. "InGaAs Photodiodes," (Ed: Hamamatsu-Photonics) 2015.

Hamamatsu, K.K. "Si Photodiodes," (Ed: Hamamatsu-Photonics), 2017.

Hornbeck, J.A., et al. "Trapping Minority Carriers in Silicon. I P-Type Silicon" Phys. Rev. 1955, 97, 311.

Kim, J.S., et al. "Toward air-stable multilayer phosphorene thin-films and transistors" Scientific Reports 2015, 5, 8989.

Koenig, S. P., et al. "Electron Doping of Ultrathin Black Phosphorus with Cu Adatoms" Nano Letters 2016, 16, 2145.

Konstantatos, G., et al. "Hybrid graphene-quantum dot phototransistors with ultrahigh grain" Nat. Nanotechnol. 2012, 7, 363.

Kresse, G., et al. "Efficient iterative schemes for ab initio total-energy calculations using a plane-wave basis set" Physical Review B 1996, 54, 11169.

Leong, W.S., et al. "Low-Contact-Resistance Graphene Devices with Nickel-Etched-Graphene Contacts" ACS Nano 2014, 8, 994.

Li, L., et al. "Black phosphorus field-effect transistors" Nat Nano 2014, 9, 372.

Li, L., et al. "High-Performance p-Type Black Phosphorus Transistor with Scandium Contact" ACS Nano 2016, 10, 4672.

Ling, Z.P., et al. "Black Phosphorus Transistors with Near Band Edge Contact Schottky Barrier" Scientific Reports 2015, 5, 18000.

Liu, C.H., et al. "Graphene photodetectors with ultra-broadband and high responsivity at room temperature" Nat. Nanotechnol. 2014, 9, 273.

Liu, H., et al. "Phosphorene: An Unexplored 2D Semiconductor with a High Hole Mobility" ACS Nano 2014, 8, 4033.

Liu, H., et al. "The Effect of Dielectric Capping on Few-Layer Phosphorene Transistors: Tuning the Schottky Barrier Heights" IEEE Electron Device Letters 2014, 35, 795.

Liu, Y., et al. "Al-Doped Black Phosphorus p—n Homojunction Diode for High Performance Photovoltaic" Advanced Functional Materials 2017, 1604638.

Long, G., et al. "Achieving Ultrahigh Carrier Mobility in Two-Dimensional Hole Gas of Black Phosphorus" Nano Letters 2016.

Long, M., et al. "Room temperature high-detectivity mid-infrared photodetectors based on black arsenic phosphorus" Sci. Adv. 2017, 3, e1700589.

Na, J., et al. "Few-Layer Black Phosphorus Field-Effect Transistors with Reduced Current Fluctuation" ACS Nano 2014, 8, 11753.

Perello, D.J., et al. "High-performance n-type black phosphorus transistors with type control via thickness and contact-metal engineering" Nat Commun 2015, 6.

Prakash, Amit, et al. "Black Phosphorus N-Type Field-Effect Transistor with Ultrahigh Electron Mobility via Aluminum Adatoms Doping" Small 2017, 13, 1602909.

Qiao, J., et al. "High-mobility transport anisotropy and linear dichroism in few-layer black phosphorus" Nature Communications 2014, 5, 4475.

Rudenko, A.N., et al. "Intrinsic Charge Carrier Mobility in Single-Layer Black Phosphorus" Physical Review Letters 2016, 116, 246401.

Ryder, C.R., et al. "Covalent functionalization and passivation of exfoliated black phosphorus via aryl diazonium chemistry" Nature

(56) References Cited

OTHER PUBLICATIONS

Chemistry, May 2, 2016, vol. 8, pp. 597-602 [Retrieved on Jun. 13, 2018]<DO:10.1038/NCHEM.2505>Abstract and Supplementary Information.

Soci, C., et al. "ZnO Nanowire UV Photodetectors with High Internal Gain" Nano Lett. 2007, 7, 1003.

Some, S., et al. "Highly Air-Stable Phosphorus-Doped n-Type Graphene Field-Effect Transistors" Advanced Materials 2012, 24, 5481.

Sun, J., et al. "Formation of Stable Phosphorus-Carbon Bond for Enhanced Performance in Black Phosphorus Nanoparticle-Graphite Composite Battery Anodes" Nano Letters 2014, 14, 4573.

Tan, W.C., et al. A Black Phosphorus Carbide Infrared Phototransistor. Adv. Mater. Dec. 21, 2017, vol. 30, No. 6, pp. 17-5039: 1-8 [Retrieved on Jun. 13, 2018]<DOI: 10.1002/ADMA.201705039> Abstract and Supplementary Information.

Tan, W.C., et al. Few-Layer Black Phosphorus Carbide Field-Effect Transistor via Carban Doping. Adv. Mater. Apr. 12, 2017, vol. 29, No. 24, pp. 1700503: 1-7 [Retrieved on Jun. 13, 2018<DOI:10.1002/ADMA.201700503>Abstract and Supplementary Information.

Wang, G., et al. "Carbon phosphide monolayers with superior carrier mobility" Nanoscale 2016, 8, 8819.

Wen, Y., et al. "Synthesis of Phosphorus-Doped Graphene and its Wide Potential Window in Aqueous Supercapacitors" Hulicova-Jurcakova, Chemistry—A European Journal 2015, 21, 80.

Wood, J.D., et al. "Effective Passivation of Exfoliated Black Phosphorus Transistors against Ambient Degradation" Nano Letters 2014, 14, 6964.

Xia, F., et al., "Rediscovering black phosphorus as an anisotropic layered material for optoelectronics and electronics" Nature Communications 2014, 5, 4458.

Xu, Y., et al. "Direct evaluation of low-field mobility and access resistance in pentacene field-effect transistors" Appl. Phys. 107, 114507 (2010).

International Search Report issued in corresponding International Patent Application No. PCT/SG2018/050145 dated Jul. 1, 2018, consisting of 5 pp.

Wang, C. et al. "Unipolar n-Type Black Phosphorus Transistors with Low Work Function Contacts" (2018) Nano Lett. 18: 1822-2827.

* cited by examiner

CRYSTALLINE MATERIAL, PHOTOTRANSISTOR, AND METHODS OF FABRICATION THEREOF

FIELD OF INVENTION

The present invention relates broadly to a crystalline material, a phototransistor, and methods of fabrication thereof, and in particular to a black prosperous carbide crystalline material, a black prosperous carbide photo transistor, and methods of fabrication thereof.

BACKGROUND

Any mention and/or discussion of prior art throughout the specification should not be considered, in any way, as an admission that this prior art is well known or forms part of common general knowledge in the field.

Photodetectors are a key component of many devices used today, from metrology and imaging to optical communications. As one example, light detection and ranging (LIDAR) systems are currently used in many commercial applications that measure distance to a target by illuminating that target with a laser light (e.g. self-driving car, drone remote sensing, and laser guidance). The Sensitivity and the range can be greatly improved if a sensor operating in the long-wavelength infrared (also referred to as far-infrared) regime of the electromagnetic spectra can be used because the earth atmosphere (mostly $H_2O$, $O_3$, and $CO_2$) has good transparency in this spectral range.

Currently, different technologically important wavelength regimes are detected by different techniques/materials, such as by separate photoactive semiconductors with appropriate bandgaps. For example, gallium nitride (GaN), silicon (Si) and Indium gallium arsenide (InGaAs) are typically exploited for sensing in the ultraviolet, visible and near-infrared regimes while the detection of mid-infrared wavelength generally relies on small-bandgap semiconductor compounds such as mercury cadmium telluride (HgCdTe), lead sulfide (PbS) or lead selenide (PbSe). Thermal sensing techniques are utilized for detection in the far-infrared regime.

The rapid proliferation of connectivity, availability of cloud computing, and miniaturization of sensors and communications chips have made it possible for many devices to be networked together to create the Internet-of-things (IoT).

The demand is set to rise for a broadband optical sensor that can cover as many important wavelength regimes as possible so that physically only one type of optical sensor is needed at various wavelengths.

Embodiments of the present invention seek to address at least one of the above problems.

SUMMARY

In accordance with a first aspect of the present invention, there is provided a crystalline material comprising a plurality of stacked two-dimensional black phosphorous carbide layers.

In accordance with a second aspect of the present invention, there is provided a phototransistor comprising the crystalline material of the first aspect.

In accordance with a third aspect of the present invention, there is provided a method of forming the crystalline structure of the first aspect or the phototransistor of the second aspect, comprising repeated pulsing and purging of an organometallic precursor for doping a black phosphorus with carbons.

BRIEF DESCRIPTION OF THE DRAWINGS

Embodiments of the invention will be better understood and readily apparent to one of ordinary skill in the art from the following written description, by way of example only, and in conjunction with the drawings, in which:

FIG. 7(c) shows a TOF-SIMS that shows the formation of phosphine (i.e. PHx) when displaced phosphorus atoms diffused into the thermally decomposed TMA layer and reacted with the hydrocarbons bonded to the Aluminum, according to an example embodiment.

DETAILED DESCRIPTION

Figure 1:
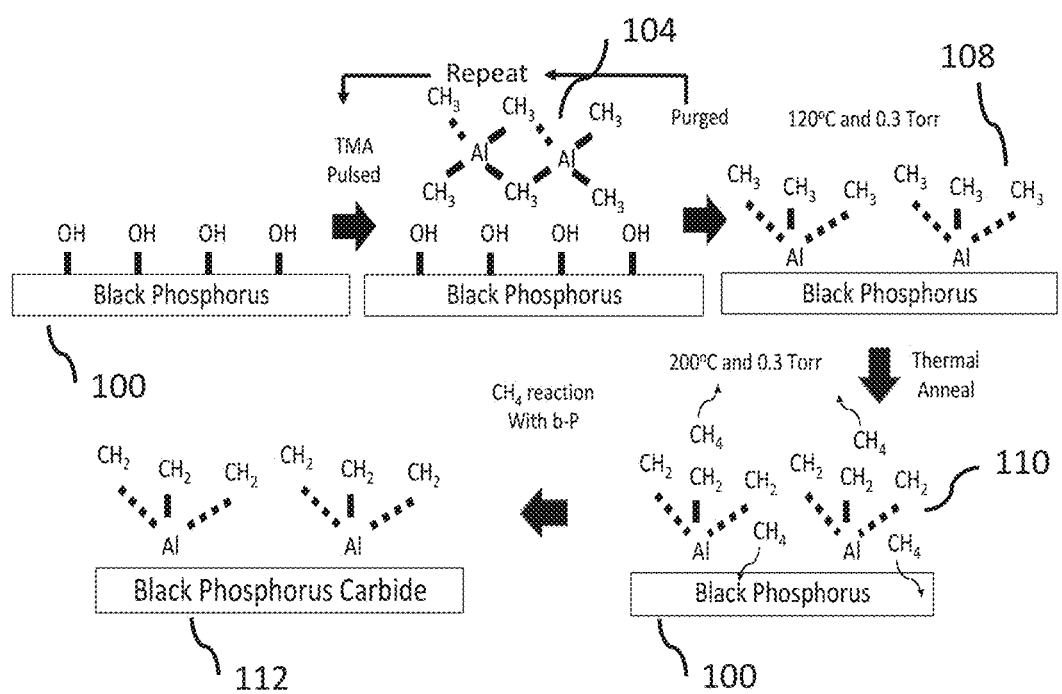
FIG. 1 shows a schematic flow diagram of the synthesis of phosphorus carbide via carbon doping of black phosphorus using atom layer deposition of Trimethylaluminium, according to an example embodiment.

In one embodiment of the present invention, a generic process is provided which can be used to transform a two-dimensional black phosphorus into a black phosphorus carbide. The main field of application of black phosphorous carbide according to example embodiments includes the ultra-low power and high speed flexible electronics technologies that are based on two-dimensional layered materials operating in the long-wavelength infrared (LWIR) regime of the electromagnetic spectra. This electromagnetic spectral range is important for applications such as range finding using LIDAR (Light Detection And Ranging) systems because the earth atmosphere (mostly $H_2O$, $O_3$, and $CO_2$) has good transparency in this spectral range (starting at around 8 μm).

Example embodiments of the present invention provide a high-performance composite few-layer b-PC, such as for use in a p-FET, fabricated via a carbon doping technique which achieved a high mobility of 1995 cm$^2$V$^{-1}$s$^{-1}$ at room temperature. First-principles calculations show a stable b-PC with an effective mass of carriers that is lighter than b-P along the armchair direction and a band gap in the low wavelength infrared (LWIR) regime. Raman spectroscopy, energy dispersive X-ray (EDX) spectroscopy, X-ray photoelectron spectroscopy (XPS), and the time of flight secondary ion mass spectrometry (TOF-SIMS) have all been used to characterize example embodiments of the present invention and confirm the presence of a b-PC channel. Low-temperature transport measurement of the b-PC in a p-FET revealed a conductivity that is semi-metallic at T<100 K, which is different from b-P p-FET, and a transportation limited by optical phonon scattering at T>100 K. In example embodiments the contact resistance of the b-PC in a p-FET was advantageously reduced to 289 Ω-μm via an edge contacted metal/b-P interface at the source/drain created by sputtering and a NiP alloy contact formed by thermal annealing. The results obtained from example embodiments suggest a family of new layered semiconductors with anisotropic high mobility and tunable band gaps in the LWIR regime can be synthesize from b-P via carbon doping. It is envisioned that this family of new layered semiconductors will eventually reach a mobility higher than b-P and find unique applications for electronic and optoelectronic devices operating in the infrared regime.

The generic process according to an example embodiments is described as follows: With reference to the schematic flow diagram shown in FIG. 4, which will be described in more detail below. In general, after the mechanical exfoliation of black phosphorus onto a heavily doped Si/SiO$_2$ substrate, the sample is immediately transferred into an atomic layer deposition (ALD) chamber where trimethylaluminum (TMA), i.e. Al$_2$(CH$_3$)$_6$, precursor is repeatedly pulsed and purged at a substrate temperature of about 100 to 140° C., preferably 110 to 130° C., and most preferably about 120° C. and a chamber pressure of about 0.3 Torr. At this temperature, the TMA would first adsorb as dimers and then dissociate into monomers upon heating to about 120° C. After metal patterning, deposition, and lift-off, the patterned sample is subjected to another thermal treatment at about 180 to 220° C., preferably 190 to 210° C., and most preferably about 200° C. Further heating of the TMA monomers to about 200° C. causes one of the methyl groups in the TMA to react with a hydrogen on another methyl group, liberating methane CH$_4$. This leaves the CH$_2$ group bound to the aluminum as a thermally decomposed TMA, Al$_2$(CH2)$_6$, and the free radicals CH$_4$ to react with black phosphorus, breaking the P—P bonds and reorganizing the black phosphorus channel into a black phosphorus carbide channel.

With reference to the schematic flow diagram shown in FIG. 1, the synthesis of phosphorus carbide via carbon doping of black phosphorus using atom layer deposition of Trimethylaluminium according to an example embodiment will now be described. Few-layer black phosphorus 100 is mechanically exfoliated from a bulk single-crystal BP (purity 99.998%, Smart Element) onto a degenerately doped Si substrate (not shown) with a pre-grown thermal oxide (e.g. 90 or 300 nm) at the surface. It is noted that other substrates may be used in different embodiment, for example Sapphire. The exfoliation is performed inside an argon-filled glove box in this embodiment, where the concentration of O$_2$ and H$_2$O is under control at a level below 1 ppm. Immediately after the exfoliation, the black phosphorus 100 is doped with hydrocarbons inside an atomic layer deposition (Savannah ALD) chamber at about 0.3 Torr using only TMA precursor 104 pulsing at a low substrate temperature of about 100 to 140° C., preferably 110 to 130° C., and most preferably about 120° C. for about 15 ms and purged with N$_2$ at about 20 sccm for about 10 s. The pulsing of TMA and N$_2$ is then repeated for different number of cycles. At this temperature, the TMA first adsorbs as dimers and then dissociate into monomers 108 upon heating to 120° C. The optimum number of pulsing cycles was found to depend on the thickness of the black phosphorus 100 and can be determined by the measured carrier mobility according to example embodiments. The sample is then thermally treated to about 180 to 220° C., preferably 190 to 210° C., and most preferably about 200° C. in the atomic layer deposition chamber for the same duration (~53 minutes) it takes to grow an Al$_2$O$_3$ passivation layer (20 nm, not shown) on the sample. The growing of the Al$_2$O$_3$ passivation layer is done at the same time when the sample is undergoing the 200° C. thermal treatment, specifically by pulsing and purging about 200 times at about 200° C. with TMA (pulsed at about 15 ms) and water (pulsed at about 15 ms) as the precursors, and purged with N$_2$ at about 20 sccm for about 8 s, according to a non-limiting example. The heating of the TMA monomers 108 to about 200° C. causes one of the methyl groups in the TMA to react with a hydrogen on another methyl group, liberating methane CH$_4$. This leaves the CH$_2$ group bound to the aluminum as a thermally decomposed TMA 110, Al$_2$(CH$_2$)$_6$, and the free radicals CH$_4$ to react with the black phosphorus 100, breaking the P—P bonds and reorganizing the black phosphorus 100 channel into a black phosphorus carbide 112 channel.

To study the formation and physical properties of the layered semiconductor according to example embodiments, first-principles calculations were performed on a few-layers b-PC. The calculations are conducted within the framework of the density functional theory (DFT) using the Vienna Ab initio simulation package (VASP)[9]. Since the cohesive energy of b-PC monolayers (1L) with various stoichiometric compositions ($P_xC_{1-x}$) has been calculated and found to be lower than graphene but higher than phosphorene, it implies that layers of b-PC with different compositions are possible to be synthesized in different embodiments by controlling the atomic ratio of P to C[10]. P$_2$C$_2$ was chosen among many allotropes of b-PC as a representative of the P—C layered sheet to study the effect of the layered thickness on a b-PC with equal composition of carbon and phosphorus atoms.

Figure 2:
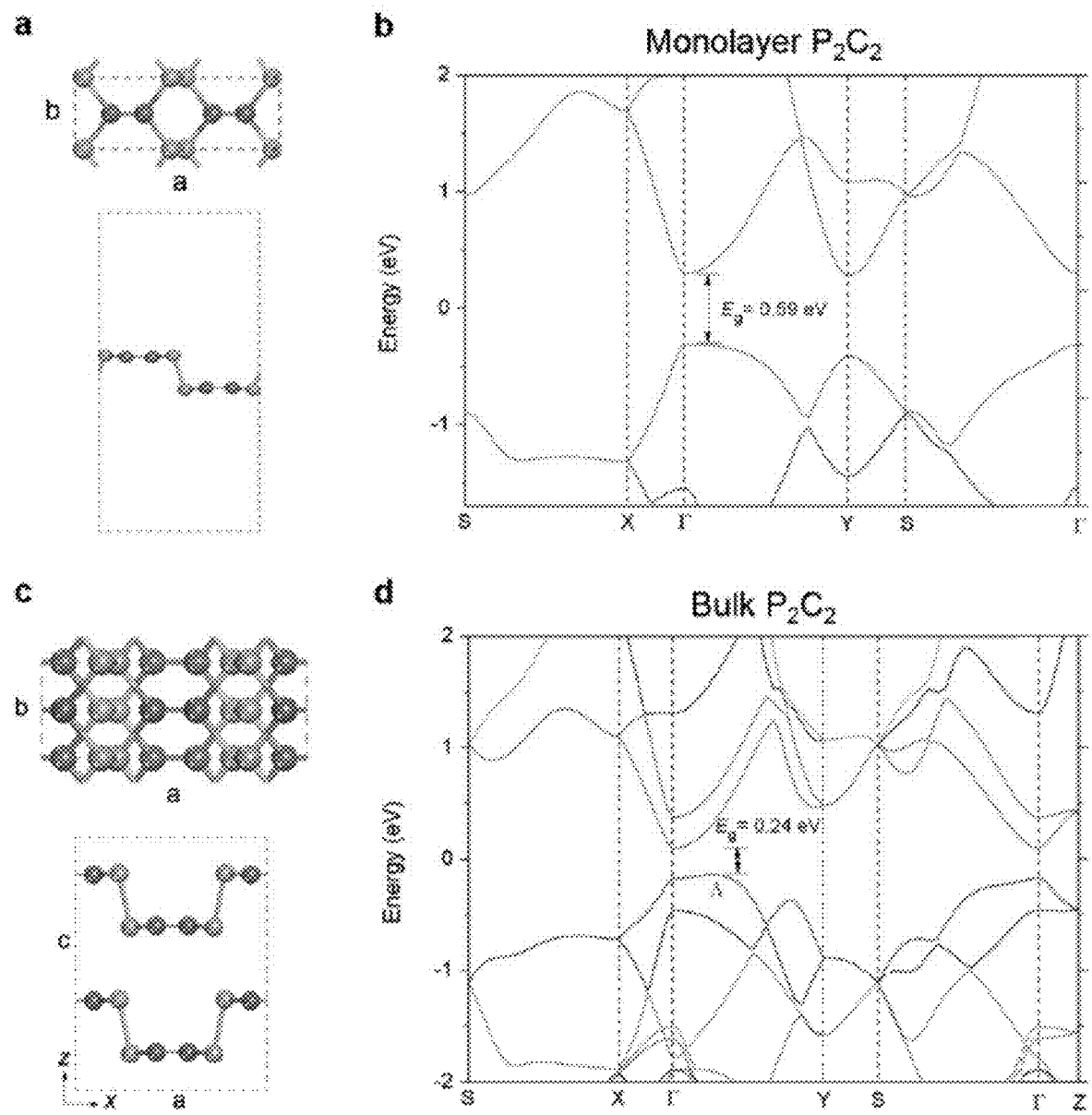
FIGS. 2(a) and (b) show the atomic and band structures, respectively, of a monolayer (1L) $P_2C_2$ (orthorhombic lattice with a=8.328 Å and b=2.927 Å).
FIGS. 2(c) and (d) show AB stacking with a half lattice shift of b/2 along b direction as and the band structures of this configuration, respectively, for the bulk $P_2C_2$.

FIGS. 2(a) and (b) show the atomic and band structures, respectively, of a monolayer (1L) P$_2$C$_2$ (orthorhombic lattice with a=8.328 Å and b=2.927 Å), and is the stable structure based on the previous calculation[11]. To simulate a few-layers b-PC, various stacking possibilities for bulk P$_2$C$_2$ (orthorhombic lattice with a=8.042 Å, b=2.923 Å, and c=10.763 Å) and different relative alignments of P$_2$C$_2$ layers have been considered in the calculation. It was found the most stable configuration is AB stacking with a half lattice shift of b/2 along b direction as shown in FIG. 2(c). FIG. 2(d) shows the band structures of this configuration for the bulk P$_2$C$_2$. When comparing the band structures of the bulk P$_2$C$_2$ in FIG. 2(d) to the monolayer P$_2$C$_2$ in FIG. 2(b), one can see two differences. First, the band gap decreases from 0.59 eV for 1L P$_2$C$_2$ to 0.24 eV for bulk P$_2$C$_2$. Second, the peak of the valence band at Γ in 1L P$_2$C$_2$ has shifted from Γ to Λ point when it becomes bulk P$_2$C$_2$. Thus, 1L P$_2$C$_2$ is a semiconductor with a direct band gap while bulk P$_2$C$_2$ and few-layers P$_2$C$_2$ are semiconductors with an indirect band gap. Despite the differences in band gap, both band structures show a highly anisotropic behavior at Γ which is due to anisotropic puckered structure of the sheets. P$_2$C$_2$ (1-5L) has a smaller effective mass of hole and electron carriers than b-P (1-5L) in the armchair (x) direction. Lastly, the choice of a b-PC with equal composition is deliberate so that another b-PC monolayer with a different stoichiometric composition can be added to simulate a bilayer hetero-layer structures of the form, $P_2C_2$-$C_{1-x}P_x$. This can extend the theoretical study into hetero-layer b-PC structures, which is experimentally a possibility for a few-layers b-PC synthesized from b-P via carbon doping according to example embodiments. In FIGS. 2(a) and (c), darker circles illustrate carbon atoms and brighter circles illustrate phosphorus atoms.

Figure 3A:
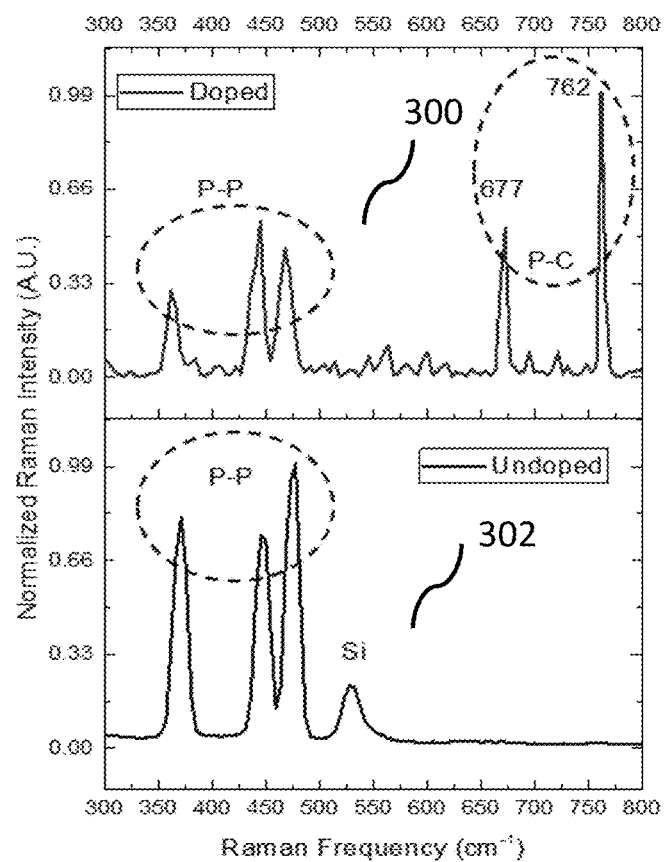
FIG. 3(a) shows the Raman spectra of a few layers black phosphorous carbide (b-PC) with (curve 200) the doping of carbons, according to an example embodiment and without (curve 202).
Figure 3B:
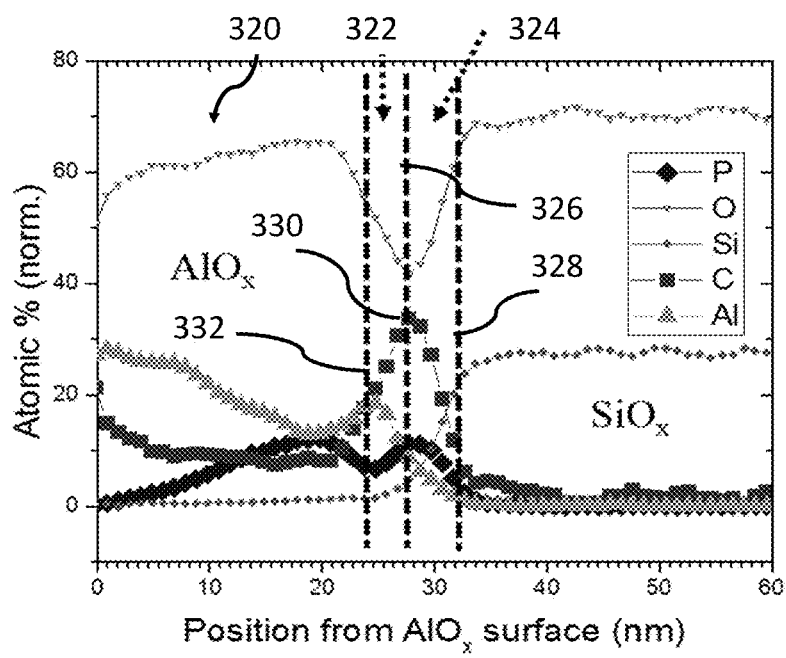
FIG. 3(b) shows the energy dispersive X-ray (EDX) spectrograph of a cross-section channel profile of the b-PC p-FET, according to an example embodiment.
Figure 3C:
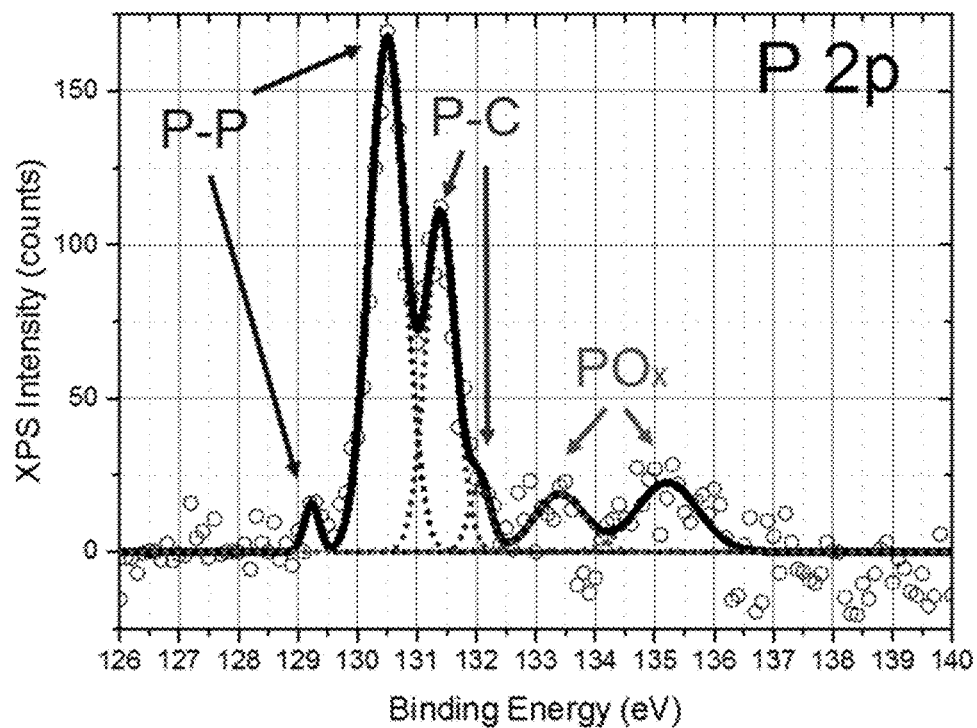
FIG. 3(c) shows the X-ray photoelectron spectroscopy (XPS) spectra of the P 2p core level of the b-PC, according to an example embodiment.
Figure 3D:
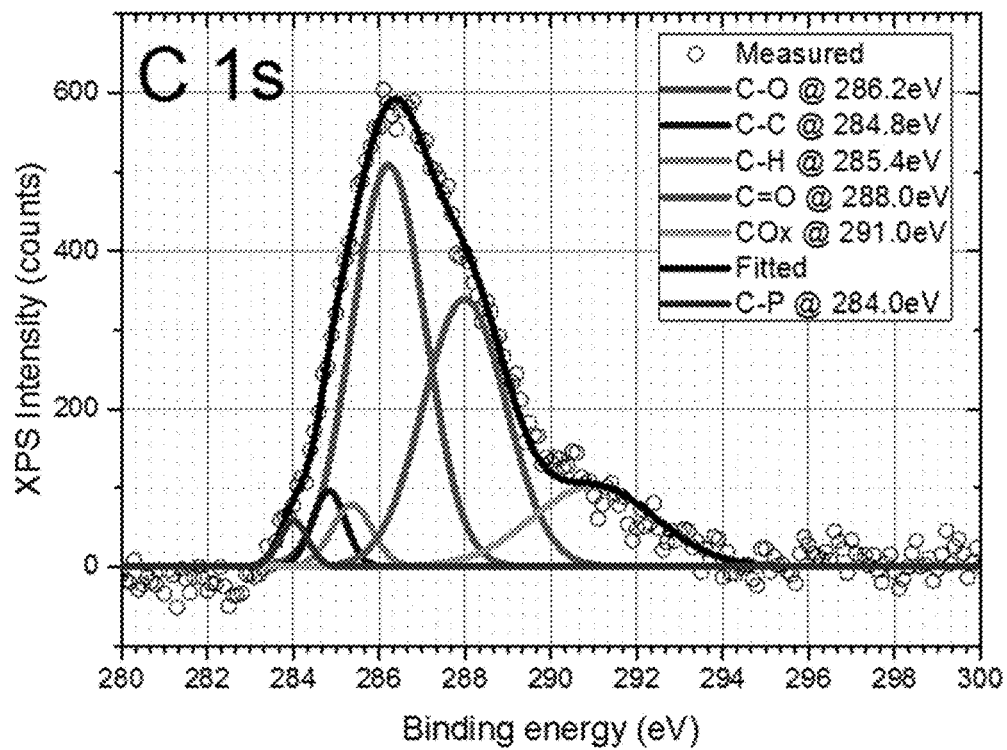
FIG. 3(d) shows the binding energy at 284.0 eV in the XPS spectra of the C 1s core level in assigned to the covalent P—C bonds, according to an example embodiment.
Figure 3E:
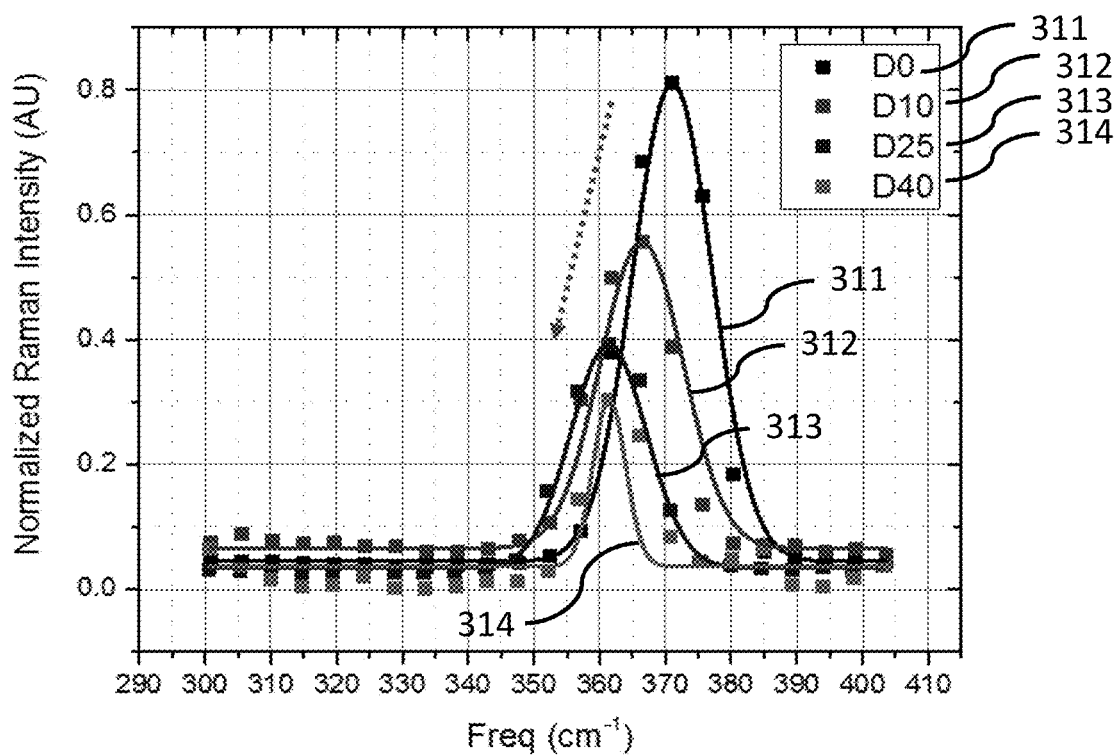
FIG. 3(e) shows Raman intensity and frequency spectra illustrating the doping effect of the TMA on the b-P, according to example embodiments, where the Raman intensity and frequency of the out of plane phonon mode, $A_g^1$, in b-PC have respectively shown to decrease and red-shifted with the number of doping cycles increasing from curve 211 to 214 from 0 to 40 cycles.
Figure 3F:
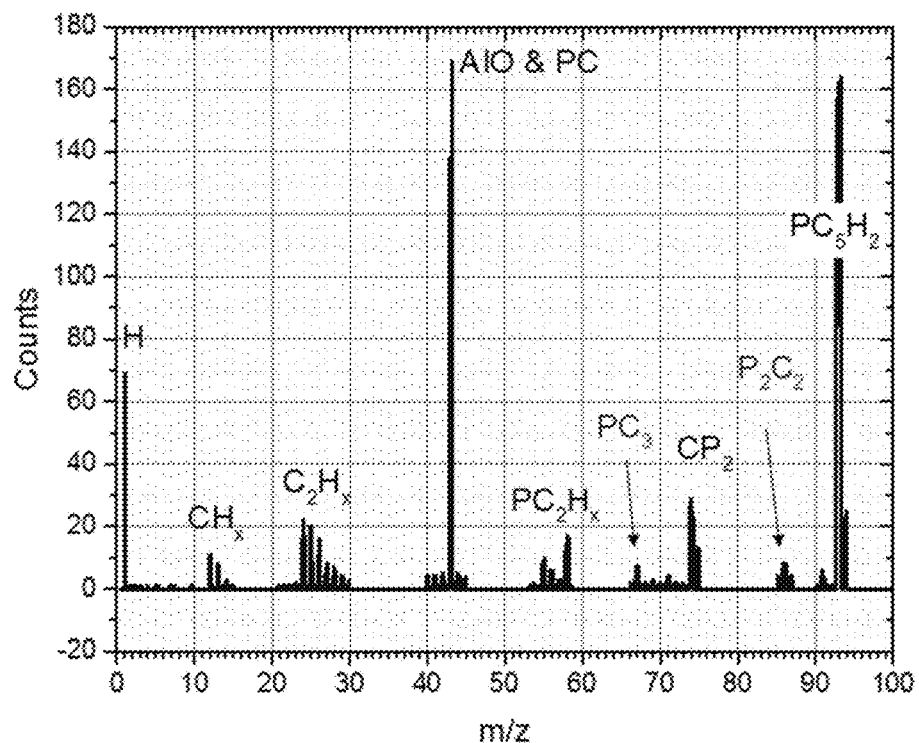
FIG. 3(f) shows the time-of-flight secondary ion mass spectroscopy (TOF-SIMS) spectra of the b-PC, according to an example embodiment, confirming the presence of some chemical species which are the allotropes of phosphorus carbide in the sample.

FIG. 3(a) shows the Raman spectra of a few layers black phosphorous carbide (b-PC), i.e. with the doping of carbons according to an example embodiment (curve 300), and without the doping of carbons, i.e. b-P (curve 302). Unlike the sample with no doping (curve 302), the doped sample (curve 300) possesses two prominent phonon modes of b-PC at 677 cm$^{-1}$, and 762 cm$^{-1}$, in addition to the 3 phonon modes of b-P at 365 cm$^{-1}$, 444 cm$^{-1}$, and 469 cm$^{-1}$. The P—C bond stretching modes (670-780 cm$^{-1}$), is based on theoretical calculations reported in the literature.[1, 2] The doping effect of the TMA on the b-P is also evident in FIG. 3(e), where the Raman intensity and frequency of the out of plane phonon mode, $A_g^1$, in b-PC have respectively shown to decrease and red-shifted with the number of doping cycles increasing from curve 311 to 314 from 0 to 40 cycles. It indicates the out of plane P—P bonding structure of the b-P has been chemically modified by the carbon dopants. The energy dispersive X-ray (EDX) spectrograph in FIG. 3(b) shows the cross-section channel profile of the b-PC p-FET. From the spectrograph, one can confirm the presence of the $Al_2O_3$ passivation layer 320 (~23 nm), the decomposed TMA layer 322 (~4 nm), and a high concentration of carbon in the few-layers b-PC 324 (~6 nm). The atomic concentration of carbon (~35%) is three times higher than phosphorus (~10%) in the few-layer b-PC 324 and is found to peak at the TMA/b-PC interface 326 and slowly decrease along the b-PC thickness towards the b-PC/$SiO_2$ interface 328. Per the above described DFT calculations, this high concentration of carbon would result in a composite b-PC channel consisting of a hetero-layer b-PC with a stoichiometric composition that depends on the ratio of P to C. The same EDX spectrograph also shows where in the thermally decomposed TMA layer 322 some of the displaced phosphorus atoms in b-P have diffused. The peak 330 of these diffused atoms starts at the TMA/b-PC interface 326 and decreases along the thickness of the decomposed TMA 322 towards the TMA/$Al_2O_3$ interface 332. The phosphorus atoms in the decomposed TMA 322 layer would form phosphine, $PH_x$, with the hydrocarbons in the TMA and outgas further into the $Al_2O_3$ layer 320 all the way to the surface. FIG. 3(c) shows the X-ray photoelectron spectroscopy (XPS) spectra of the P 2p core level of the b-PC. The binding energy at 131.4 eV and 132.1 eV can be assigned to the P—C bonds in b-PC based on references related to phosphorus-doped carbon materials.[3, 4] The b-PC also exhibits the spin-orbit split doublet of an exfoliated b-P at ~129.2 eV and 130.5 eV, consistent with previous XPS measurements on a b-P bulk crystals.[5] Similarly, the binding energy at 284.0 eV in the XPS spectra of the C 1s core level in FIG. 3(d) can also be assigned to the covalent P—C bonds based on reports on carbon-doped phosphorus material.[1, 4] Other than evidences of P—C bonds from Raman and XPS, the time-of-flight secondary ion mass spectroscopy (TOF-SIMS) spectra in FIG. 3(f) also confirms the presence of some chemical species which are the allotropes of phosphorus carbide in the sample. The findings are consistent with the DFT calculations and with other theoretical calculations in the literatures.[6]

In the following, example embodiments of the present invention, more particularly in the form of a back gated field effect transistor fabricated with a black phosphorus carbide channel via carbon doping of black phosphorus and two top surface Ni-alloy contacts with edge contacted interface via physical sputtering and thermal anneal will be described. The main field of application of such embodiments would be in the ultra-low power and high speed flexible electronics technologies that are based on two-dimensional layered materials operating from ultra-violet regime to the long-wavelength infrared (LWIR) regime of the electromagnetic spectra.

Figure 4:
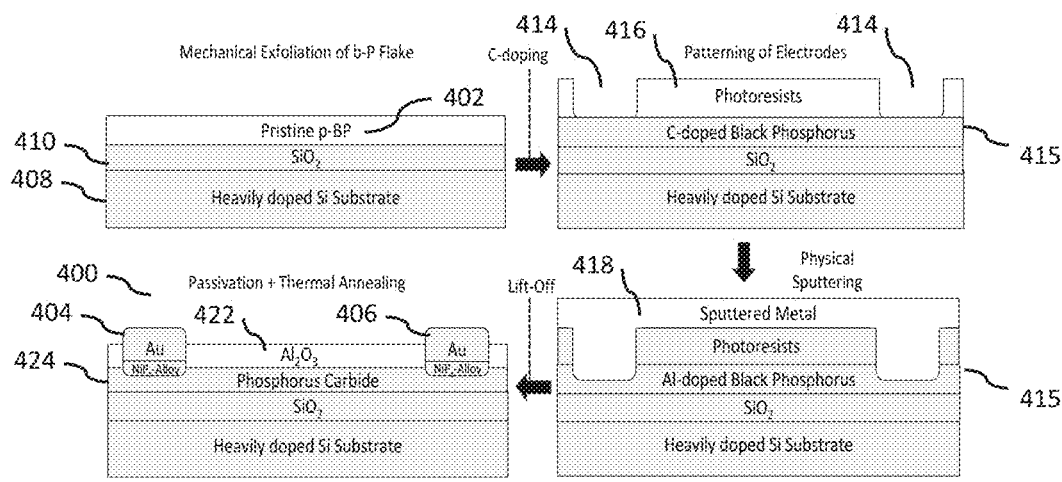
FIG. 4 shows the schematic flow diagram 4 illustrating the fabrication of a black phosphorus carbide (b-PC) phototransistor, according to an example embodiment, via carbon doping of black phosphorus and two top surface Ni-alloy contacts with edge contacted interface via physical sputtering and thermal anneal.
Figure 5:
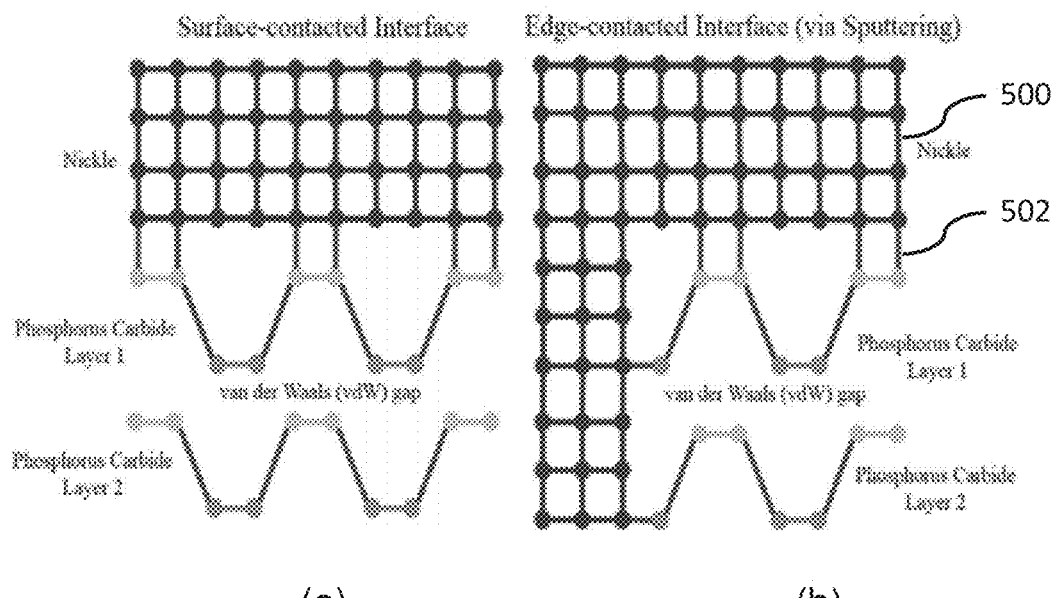
FIGS. 5 (a) and (b) show schematic diagrams of a contact with surface-contacted interface and with edge contacted interface (via sputtering) according to an example embodiment, respectively.

The schematic flow diagram shown in FIG. 4 illustrates the fabrication of a black phosphorus carbide (b-PC) phototransistor 400 according to an example embodiment via carbon doping of black phosphorus 402 and two top surface Ni-alloy contacts 404, 406 with edge contacted interface via physical sputtering and thermal anneal. Few-layer black phosphorus 402 is mechanically exfoliated from a bulk single-crystal BP (purity 99.998%, Smart Element) onto a degenerately doped Si substrate 408 with a pre-grown thermal oxide 410 (90 or 400 nm) at the surface. The exfoliation was performed inside an argon-filled glove box, where the concentration of $O_2$ and $H_2O$ is under control at a level below 1 ppm. Immediately after the exfoliation, the sample is doped with hydrocarbons inside anatomic layer deposition (Savannah ALD) chamber at about 0.3 Torr using only trimethylaluminum (TMA) precursor pulsing at a low substrate temperature of about 120° C. for about 15 ms and purged with $N_2$ at 20 sccm for about 10 s. The pulsing of TMA and $N_2$ is then repeated for different number of cycles. The optimum number of pulsing cycles was found to depend on the thickness of the black phosphorus 402 and can be determined by the measured carrier mobility. At this temperature, the TMA would first adsorb as dimers and then dissociate into monomers upon heating to about 120° C., compare also FIG. 1 described above for an embodiment of the doping process. Next, the contact patterns 414 on the carbon doped b-P channel 415 are written using a Laser Writer (LW405B) and a photoresist layer 416 and the Au/Ni (30 nm/1 nm) metals 418 are deposited by sputtering (AJA ATC-2200 UHV Sputter). By physically sputtering the channel 415, an edge-contact interface is advantageously created between the sputtered metals 418 for the contacts and the channel 415. FIGS. 5 (a) and (b) show schematic diagrams of a contact with surface-contacted interface (e.g. via thermal evaporation, ebeam evaporation, or chemical vapor deposition) and with edge contacted interface (via sputtering), respectively.

Returning to FIG. 4, the sample is then bathed in acetone for about 15 minutes during which any unwanted metals will be lifted off, leaving only the patterned metal contacts 404, 406 on the channel 424. After metal patterning deposition, and lift-off, the sample is subjected to another thermal treatment at about 200° C. in an atomic layer deposition chamber for the same duration (~53 minutes) it takes to grow an $Al_2O_3$ passivation layer 422 (20 nm) on the sample. Further heating of the TMA monomers to about 200° C. causes one of the methyl groups in the TMA to react with a hydrogen on another methyl group, liberating methane $CH_4$. This leaves the $CH_2$ group bound to the aluminum as a thermally decomposed TMA, $Al_2(CH2)_6$, and the free radicals $CH_4$ to react with black phosphorus, breaking the P—P bonds and reorganizing the black phosphorus channel into a black phosphorus carbide channel 424, compare also FIG. 1 described above for an embodiment of the b-PC channel fabrication process. With reference to FIG. 5(b), thermally treating the sample to about 200° C. also allows the Nickel 500 of the metal contact to interact with the phosphorus in b-PC channel and form a nickel-phosphide ($NiP_x$) alloy 502 with a low Schottky barrier height (i.e. low contact resistance). Returning again to FIG. 4, lastly, the growing of the Al$_2$O$_3$ passivation layer 422 is done at the same time when the sample is undergoing the about 200° C. of thermal treatment by pulsing and purging the sample about 200 times at about 200° C. with TMA (pulsed at about 15 ms) and water (pulsed at about 15 ms) as the precursors, and purged with N$_2$ at about 20 sccm for about 8 s, according to a non-limiting example.

Figure 6A:
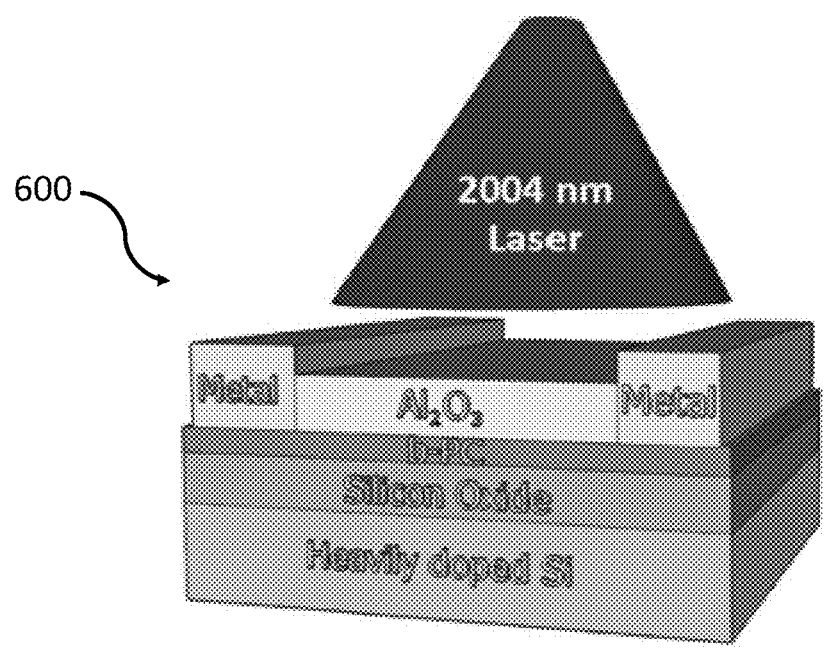
FIG. 6(a) shows the schematic diagram of the b-PC phototransistor, according to an example embodiment.
Figure 6B:
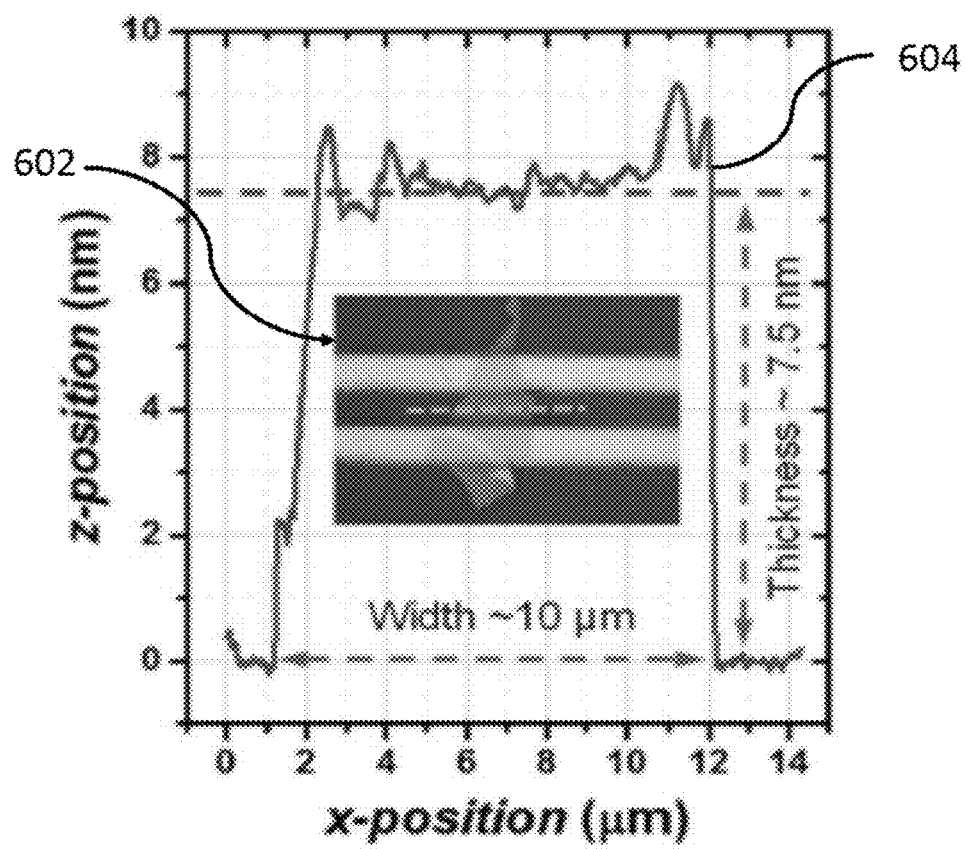
FIG. 6(b) shows the physical profile of the channel of the b-PC phototransistor, according to an example embodiment, taken using an atomic force microscopy (AFM), with an optical micrograph of the fabricated b-PC phototransistor shown in the inset.
Figure 6C:
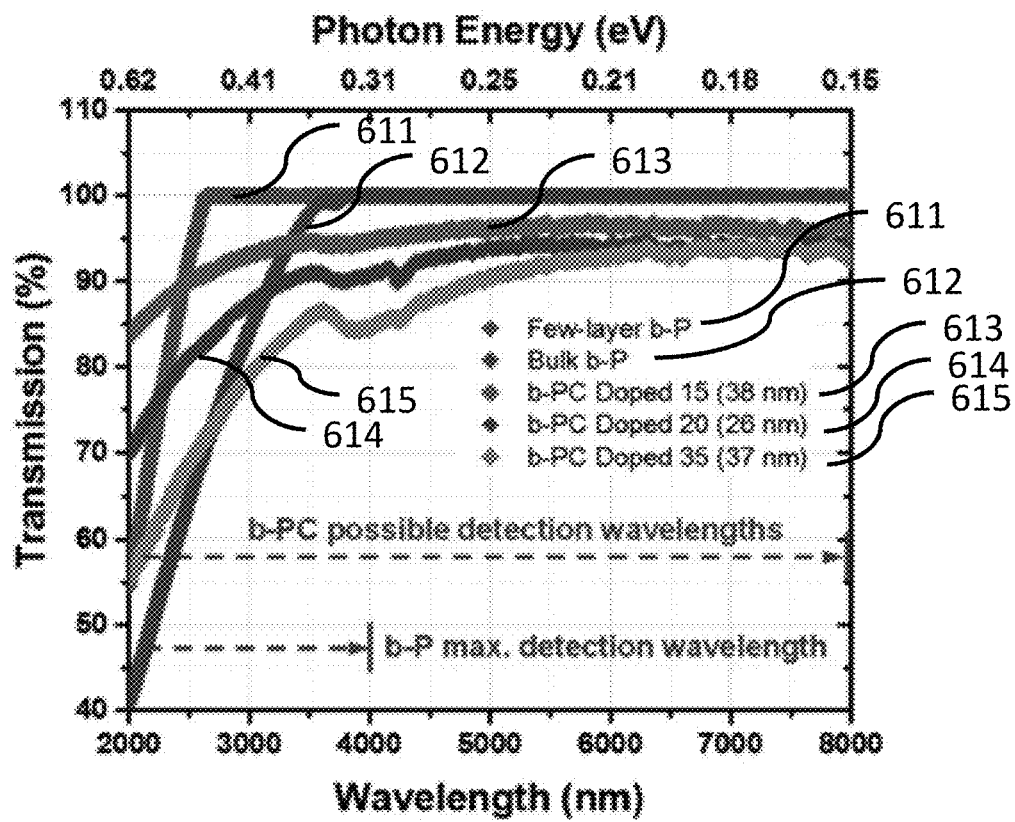
FIG. 6(c) shows the absorption spectra taken using a Fourier transform infrared spectroscopy, which displays the absorbance (expressed in terms of transmission) measured as a function of wavelengths for b-PC with different thicknesses and doping cycles, according to example embodiments.

FIG. 6(a) shows the schematic diagram of the b-PC phototransistor 600 according to an example embodiment. An optical micrograph of the fabricated b-PC phototransistor is as shown in the inset 602 of FIG. 6(b), where a sample (shown as a dashed line in the inset 602) of the physical profile of the channel is taken using an atomic force microscopy (AFM). From the AFM (curve 604), one can see that the average thickness of the about 5 μm long b-PC phototransistor is ≈7.5 nm and the width of the channel is ≈10 μm. Its hole field-effect mobility (μFE) was calculated to be 382 cm$^2$V$^{-1}$ s$^{-1}$ at a drain-to-source bias voltage (VD) of −0.2 V. The absorption spectra taken using a Fourier transform infrared spectroscopy are shown in FIG. 6(c), which displays the absorbance (expressed in terms of transmission) measured as a function of wavelengths for b-PC with different thicknesses and doping cycles, curves 611 to 615. This absorption spectrum agrees well with the bandgap energy (≈0.12 eV)[12] calculated from the first principles for a monolayer and composite b-PC[13]. The optical measurement was performed on a probe station in ambient condition using a laser diode guided through an optical fiber with a numerical aperture of 0.11 and a mode field diameter of 13 μm. The laser is placed vertically≈3 mm away from the sample via a microprobe and the calculated spot size of the laser at this height is 673 μm. The output and transfer characteristics of the b-PC phototransistor are first measured without any illumination and then under illumination at different excitation power.

Figure 7A:
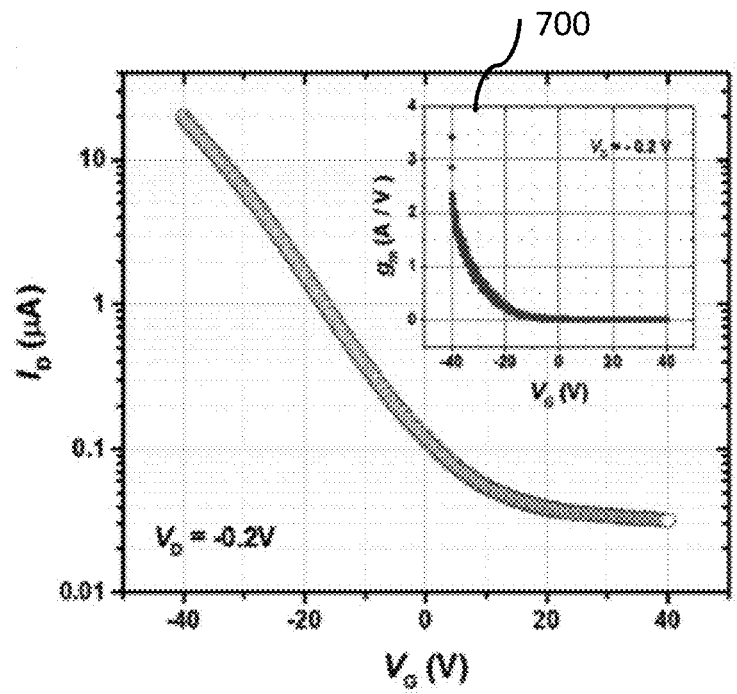
FIGS. 7(a) and (b) show the dark current ($I_D$, dark) at different operating voltages ($V_G$) and the changes in output drain current ($I_D$, illuminated) of the b-PC phototransistor, according to an example embodiment, when it is being excited by a laser with a wavelength of 2004 nm at $V_G$=−40 V, respectively.
Figure 7B:
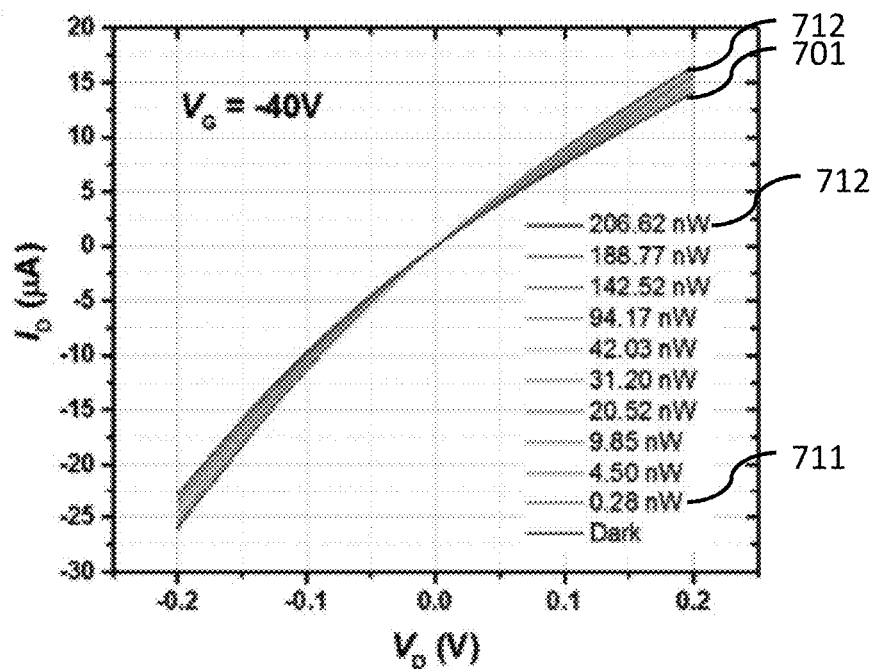
FIGS. 7(c) and (d) shows the photocurrent at different incident excitation power density (Pin) and $V_G$, respectively, extracted from the output characteristic of the phototransistor according to an example embodiment.
FIG. 7(e) shows a simple energy-band diagram to explain the observed photoconductive effect of the photodetector, according to an example embodiment.
Figure 7C:
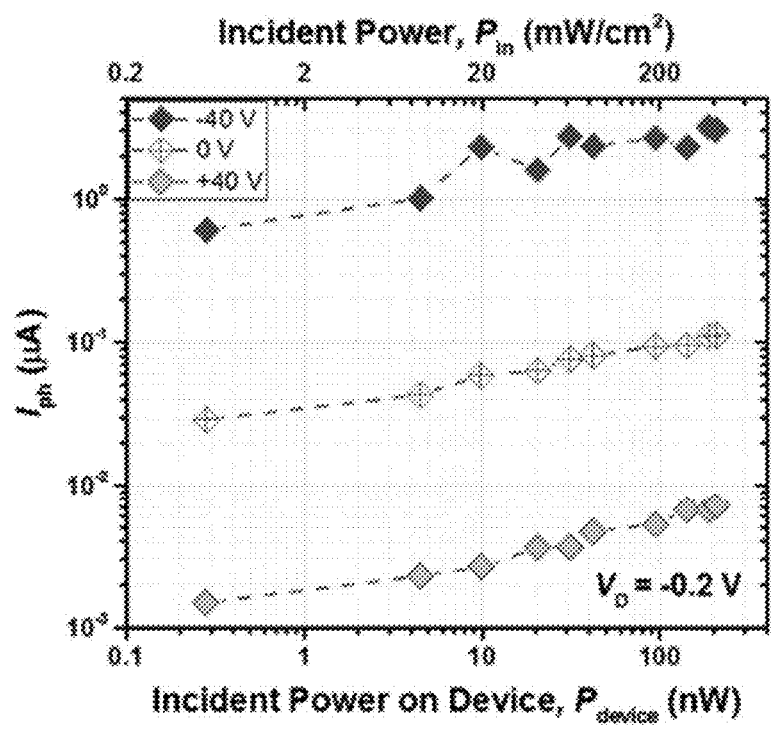
Figure 7D:
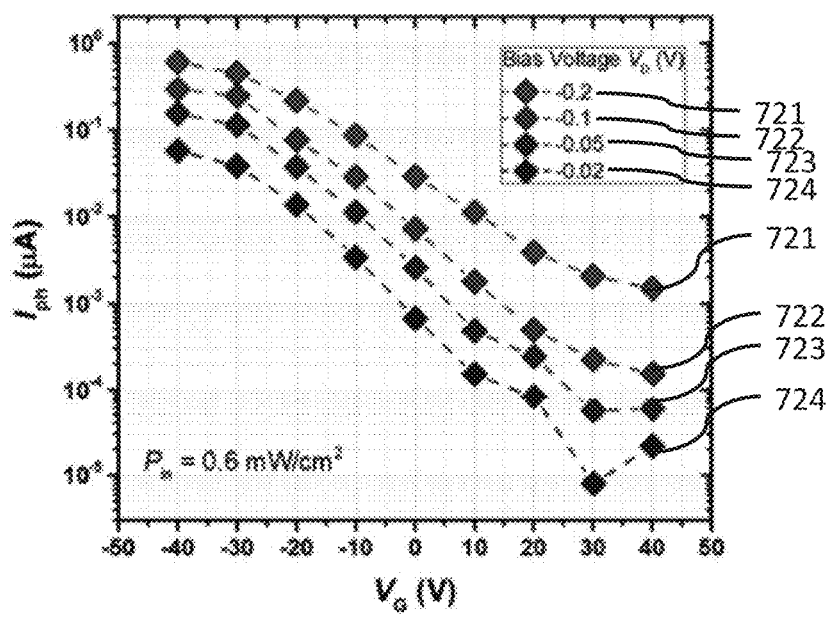
Figure 7E:
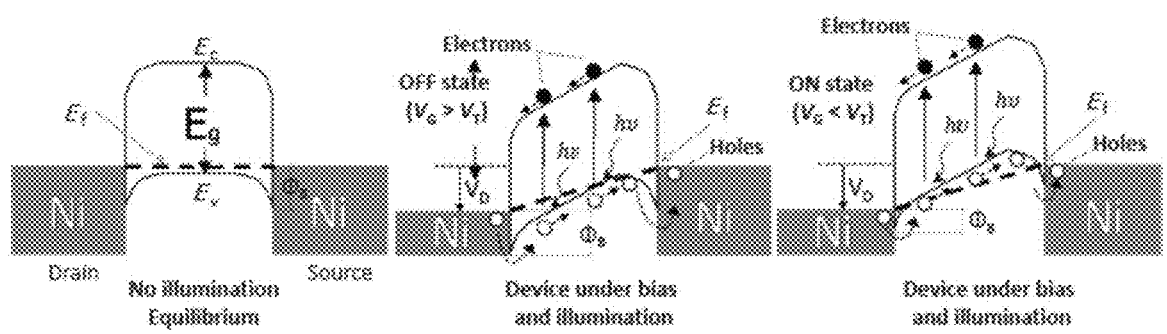

FIG. 7(a) shows the dark current (I$_D$, dark) at different operating voltages (V$_G$) at a bias voltage (V$_D$), of −0.2 V (and transconductance, g$_m$ in the inset 700). FIG. 7(b) shows the changes in output drain current (I$_D$, illuminated) of the b-PC phototransistor when it is being excited by a laser with a wavelength of 2004 nm at V$_G$=−40 V at different V$_D$ and between 0.28 nW illumination, curve 711, and 206.62 nW, curve 712. The photocurrent at different incident excitation power density (P$_{in}$) and V$_G$ are then extracted from the output characteristic of the phototransistor, I$_{ph}$=|I$_D$, illuminated|−|I$_D$, dark|, and plotted in FIGS. 7(c) and (d), respectively, where the incident power on the active region (P$_{device}$) is defined as P$_{device}$=P$_{in}$×L×W, and both L and W are, respectively, the channel length and width of the phototransistor. In FIG. 7(d), the bias voltages were −0.2 V, curve 721, −0.1 V, curve 722, −0.05 V, curve 723, and −0.02 V, curve 724. The observed photoconductive effect of the photodetector according to an example embodiment with V$_G$ can be explained by a simple energy-band diagram as shown in FIG. 7(e). When there is no illumination, V$_G$ and V$_D$, the device is in its equilibrium state, characterized by small Schottky barriers (Φ$_B$) at the contacts. Illuminating the device in its OFF state (V$_G$>V$_T$), where V$_T$ is the threshold voltage of the phototransistor, results in light absorption and excitation of electron-hole pairs, which can be extracted by applying a V$_D$. This OFF-state photocurrent would then increase with an increase in either P$_{in}$ or V$_D$, as any increase in excitation power will result in more excitation of electron-hole pairs whilst an increase in V$_D$ will lead to a reduction of the carrier transit time, $$\tau_{transit} = \frac{L^2}{\mu_{FE} V_D},$$

where μ$_{FE}$ is the transistor's hole field effect mobility, and L is the channel length. In contrast to P$_{device}$ or V$_D$, any increase in V$_G$ (i.e., more positive) increases the Schottky barriers at the contacts, resulting in a less efficient OFF-state photocurrent extraction. Similarly, the ON-state (V$_G$<V$_T$) photocurrent would also increase with either an increase in P$_{device}$ or V$_D$, or a decrease in V$_G$.

Figure 8A:
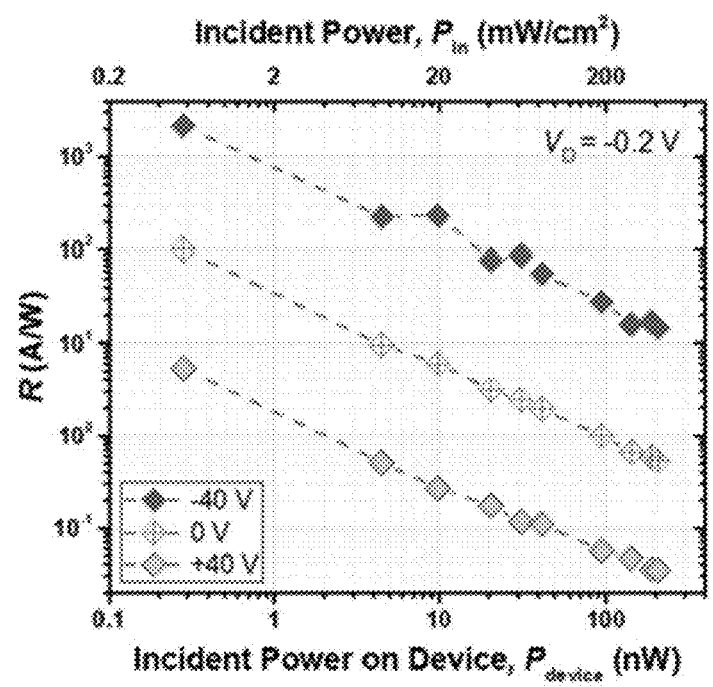
FIGS. 8(a) and (b), show the responsivity (R) of the b-PC phototransistor according to an example embodiment at different $P_{device}$, $V_G$, respectively, and $V_D$.
Figure 8B:
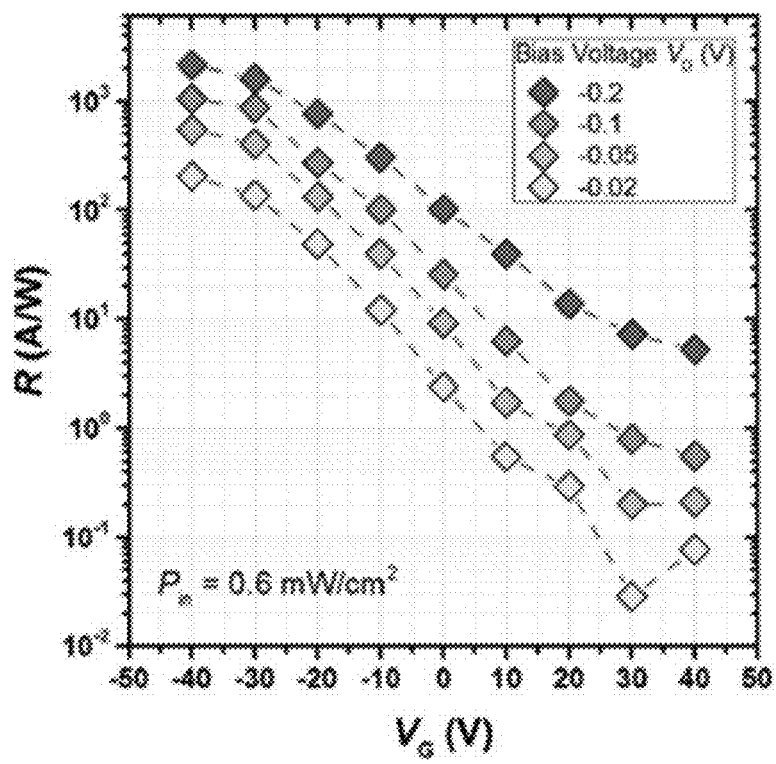
FIG. 8(c) shows the photoconductive gain and the external quantum efficiency of the b-PC phototransistor according to an example embodiment.

Next, we study the photoresponse of the b-PC photodetector according to an example embodiment at different P$_{device}$ for the same excitation wavelength of 2004 nm. FIGS. 8 (a) and (b) show the responsivity (R), where $$R = \frac{I_{ph}}{P_{device}},$$

of the b-PC phototransistor according to an example embodiment to this excitation wavelength at different P$_{device}$, V$_G$, respectively, and at different V$_D$. Unlike the photocurrent, the responsivity increases with decreasing P$_{device}$ at all V$_G$ as the photocarrier lifetime of the majority carrier (i.e., hole) is longer in a photoconductor under a lower excitation power[14]. This would allow the charge carrier to flow multiple times from the source to the drain before it recombines with a minority carrier (i.e., electron). In other words, when less electron-hole pairs (i.e., at low excitation power) are being created in the channel to fill up the trap centers, relatively more minority carrier traps would be available and thus the photocarrier lifetime of the majority carriers would be extended. This is because fewer minority carriers are available for recombination since they are being captured by the traps.

On the other hand, just like the photocurrent, the responsivity increases with V$_D$ at all V$_G$ due to a reduction of the carrier transit time when the biased voltage is increased. At room temperature, a high responsivity (R) of ≈2163 A W$^{-1}$ for an excitation wavelength of 2004 nm can be achieved with a low V$_D$ of −0.2 V and P$_{device}$ of ≈281 pW (i.e., the lowest limit of the lasing power in the setup used, at ≈0.6 mW cm$^{-2}$). This responsivity is not only higher than commercial solidstate detectors like silicon photodiodes in the visible spectrum (≈0.5 A W$^{-1}$)[15], and InGaAs detectors in the MIR spectrum (≈1.2 A W$^{-1}$)[16], but also 2D broadband detectors like the graphene photodetector (10 mA W$^{-1}$)[17], and b-AsP photodetector (180 mA W$^{-1}$ at an excitation power of 70 nW and wavelength of 3662 nm)[18]. Although a hybrid graphene detector with PbS quantum dots has demonstrated so far the largest responsivity in the visible range (5×10$^7$ A W$^{-1}$ at an excitation power of 10 fW and wavelength of 600 nm)[19], the photocarriers lifetime via photogating effect has slowed its response time to 0.1 s and narrowed its detection window to 1600 nm due to the quantum dots structure.

Figure 8C:
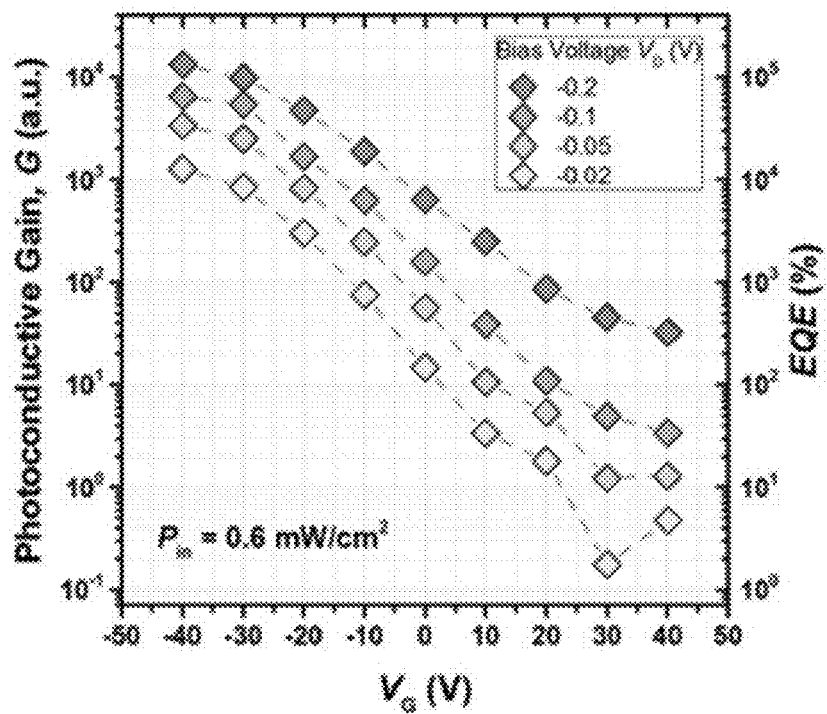

Other than responsivity, in FIG. 8(c) the external quantum efficiency, $$EQE = \frac{n_e}{n_{ph}},$$

of the b-PC phototransistor according to an example embodiment is shown, where ne is the number of the charge carriers in the photocurrent and $n_{ph}$ is the number of impinging excitation photons on the active region. The photoconductive gain is defined as $$G = \frac{n_e}{n_{ab}},$$

where $n_{ab}$ is the number of photons being absorbed (absorption≈10%). At $V_G$=−40 V and $V_D$=−0.2 V, FIG. 8(c) shows the EQE and G peak at ≈1.3×10$^5$% and 1.3×10$^4$, respectively. When the b-PC phototransistor is set to operate in the OFF state where there is little or no transconductance gain, the magnitude of this photodetection gain can be quantified based on a simple physical picture incorporating the typical lifetimes for electrons and holes carriers. Photoexcited holes carriers in the b-PC channel are first separated from the photoexcited electrons and drift to the drain by the applied $V_D$, with a typical timescale of $$\tau_{transit} = \frac{L^2}{\mu_{FE} V_D}.$$

Some of the photoexcited electrons would inevitably be held up by the minority carrier traps at the surface with a timescale of $\tau_{lifetime}$. Charge conservation in the channel would lead to hole replenishment from the source as soon as a hole carrier reaches the drain. As a result, the same photogenerated hole carrier from a single electron-hole pair excited by a photon would get to circulate multiple times in the b-PC channel, leading to photoconductive gain where $$G = \frac{\tau_{lifetime}}{\tau_{transit}},$$

indicating the importance of long lifetime and high carrier mobility. Since a photoconductive detector may exhibit a high dark current and its photocurrent is also related to its active detection area, a more complete assessment of the detector performance must include its noise equivalent power (NEP) and specific detectivity (D*). The NEP is defined as the lowest optical power that yields a unity signal-to-noise ratio for a normalized bandwidth of 1 Hz and can be calculated by dividing the noise current spectral density (PSD) of the detector at a modulation frequency of 1 Hz b its maximum responsivity, i.e., R $$NEP = \frac{PSD_{1Hz}}{R_{max}}.$$

Figure 9A:
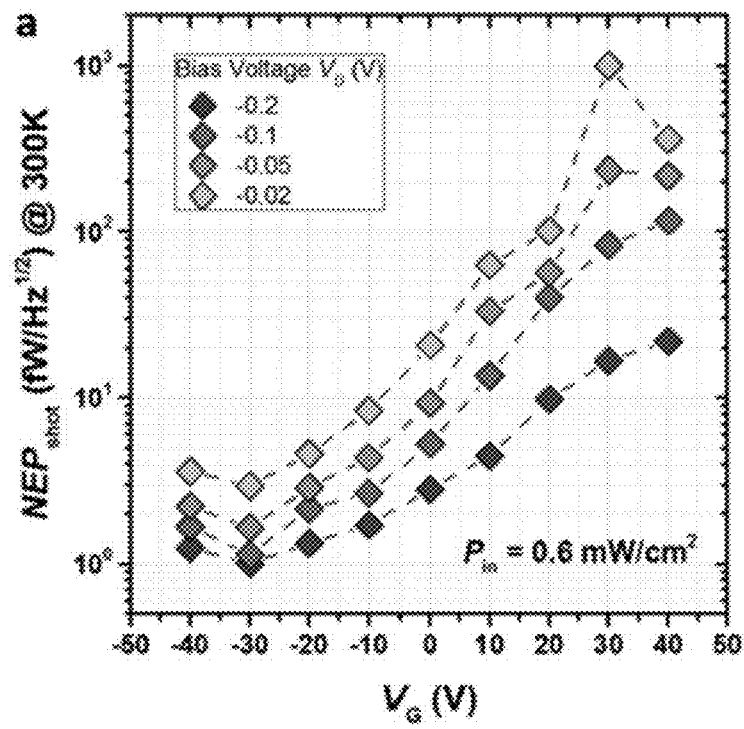
FIG. 9(a) shows the shot noise equivalent power for the b-PC phototransistor according to an example embodiment at different $V_G$.

The PSD can be obtained by measuring the dark current of the detector via a fast Fourier transform spectrum analyzer and the results reflect the overall noise effect due to thermal noise, flicker noise (1/f)[20], and shot noise of the detector. For a photoconductive detector limited only by its shot noise, the equivalent noise current density of the shot noise (PSD$_{shot}$) can be normalized from the root mean square of its dark current fluctuations as, $$PSD_{shot} = \frac{\sqrt{2qI_D \Delta f}}{\Delta f},$$

where Δf=1 Hz, $I_D$ is the drain current in the dark at maximum responsivity, and q is the electron charge. With this expression, we can calculate the shot noise equivalent power, $$NEP_{shot} = \frac{PSD_{shot}}{R_{max}},$$

for the b-PC phototransistor at different $V_G$, shown in FIG. 9(a). At $V_D$=−0.2 V and $V_G$=−40 V, the NEP$_{shot}$≈1.3×10$^{-15}$ W Hz$^{-1/2}$, indicating that infrared radiation in the femto-watt range can be detected above the shot noise level of this b-PC phototransistor with an integration time of 0.5 s. Since the spectral density of thermal and shot noise are not frequency dependent[20], and thermal noise is lower than the shot noise at all $V_D$ and $V_G$, NEP$_{shot}$ is a good white noise performance representation for our b-PC phototransistor. This performance is better than the b-P detector with an optimized photocarrier collector (NEP$_{shot}$≈4.6×10$^{-14}$ W Hz$^{-1/2}$ with a dark current of 50 μA at $V_D$=0.5 V and $V_G$=5 V)[21], and the graphene detector with a tunnel barrier that enhances its photogating effect (NEP$_{shot}$≈4.3×10$^{-15}$ W Hz$^{-1/2}$ with an operating dark current of 190 μA at $V_D$=1 V and $V_G$=−40 V)[22]. To compare detectors with different geometries, one can compute its specific detectivity, $$D^*_{shot} = \frac{\sqrt{\text{Active area}}}{NEP_{shot}}.$$

With the amount of excitation power, $P_{device}$≈13 nW, operating with a bias voltage of 0.2 V, D*≈8$^{11}$ cm·Hz$^{1/2}$/W according to an example embodiment.

Figure 9B:
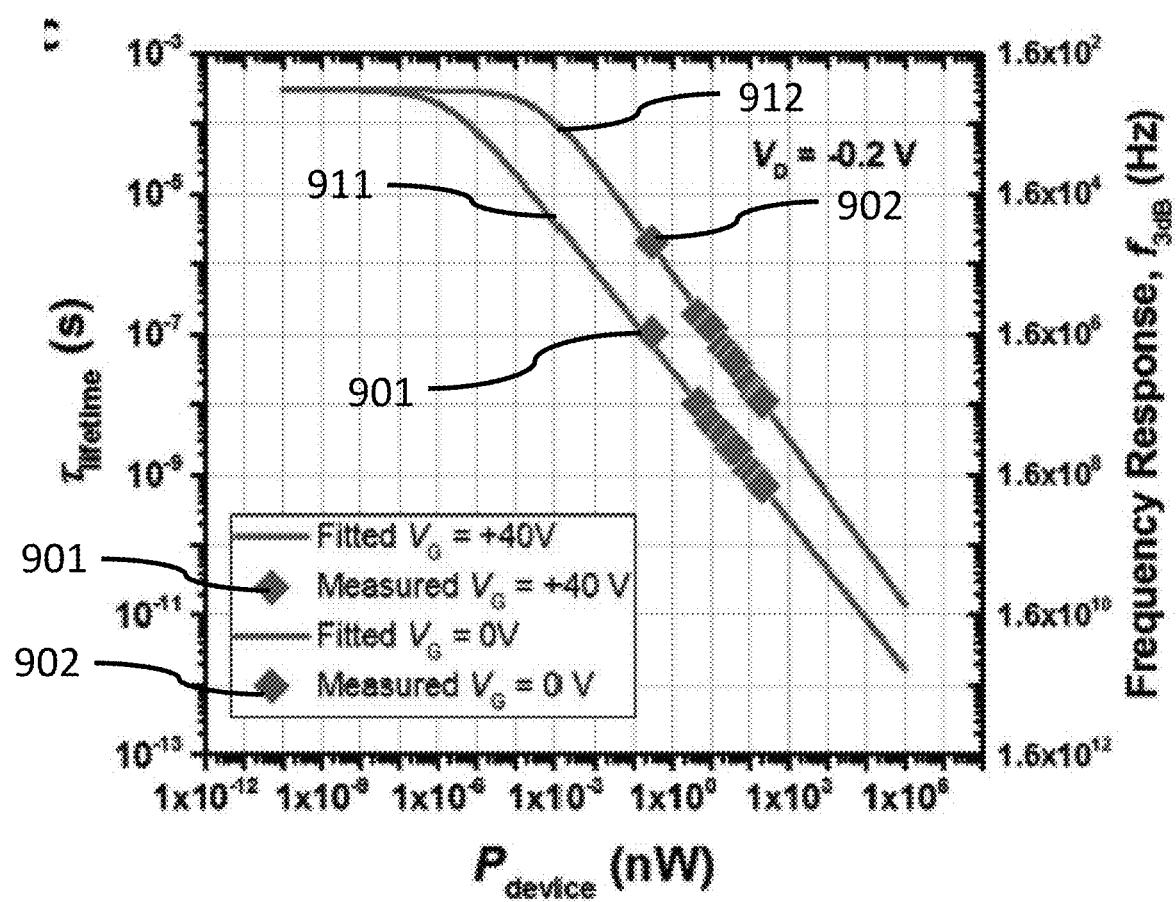
FIG. 9(b) shows the measured carrier lifetime and 3-dB cutoff frequency of the b-PC phototransistor, according to an example embodiment, under different $V_G$ and $P_{device}$ along with the respective fitted values from the Hornbeck-Haynes model.

The fundamental operating speed of this b-PC phototransistor according to an example embodiments was also studied. This can be determined from the average lifetime of the photocarriers in the channel. Using the transit time ($\tau_{transit}$≈3.27 ns) calculated from the hole carrier mobility (≈382 cm$^2$ V$^{-1}$ s$^{-1}$), one can obtain the carrier lifetime of the b-PC phototransistor according to an example embodiments from the photoconductive gain. FIG. 9(b) shows the measured carrier lifetime and 3-dB cutoff frequency of the b-PC phototransistor under different $V_G$ (points 901, 902) and $P_{device}$, along with the respective fitted values (curves 911, 912) from the Hornbeck-Haynes model[23]. The b-PC phototransistor has a calculated response time of ≈0.7 ns (or ≈0.2 GHz) at $V_G$=+40 V with $V_D$=−0.2 V and $P_{device}$≈207 nW. By using model calculations, one can extrapolate the carrier lifetime and 3-dB cutoff frequency of the b-PC phototransistor to an excitation power, $P_{device}$, not available to us in the setup used to study the example embodiment. According to the model calculations, the fundamental response time can reach up to ≈14 ps (or ≈11 GHz) at $P_{device}$≈1 mW with $V_G$=+40 V and $V_D$=−0.2 V in example embodiments. The carrier lifetime at low excitation power (so), which does not vary with $P_{device}$, is ≈0.3 ms (or ≈510 Hz).

Figure 10A:
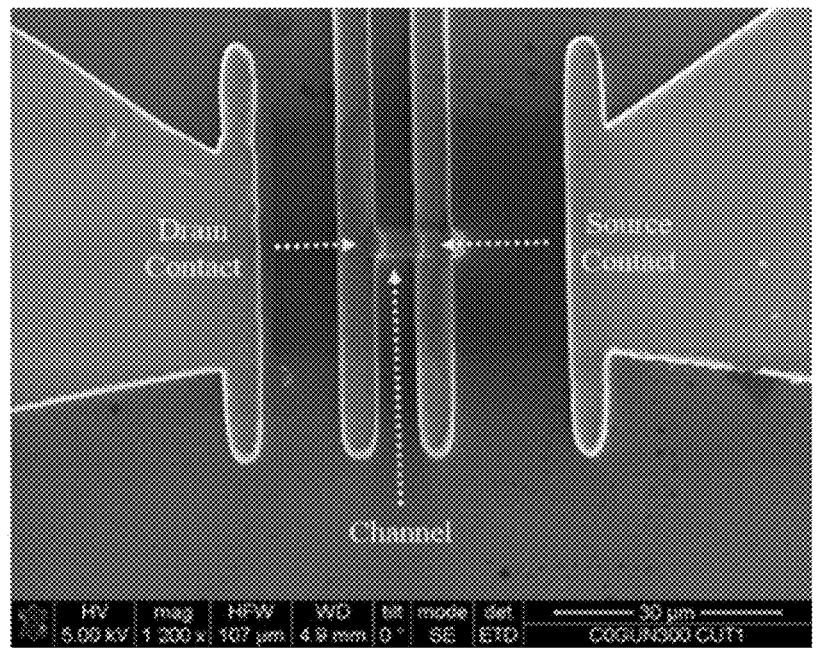
FIG. 10(a) shows a top view image of one of the b-PC p-FET according to an example embodiment fabricated on a Si/SiO2 (90 nm) substrate taken by a scanning electron microscope (SEM).
Figure 10:
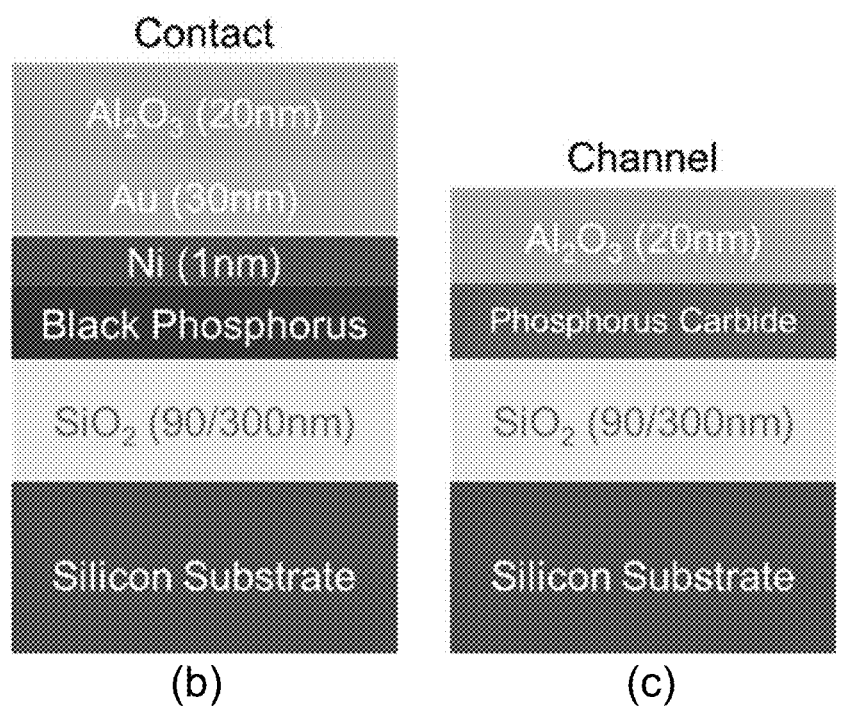
FIGS. 10(b) and (c) show the schematic layer diagram of the contact and the channel region, respectively, of a b-PC p-FET according to an example embodiment.
Figure 11A:
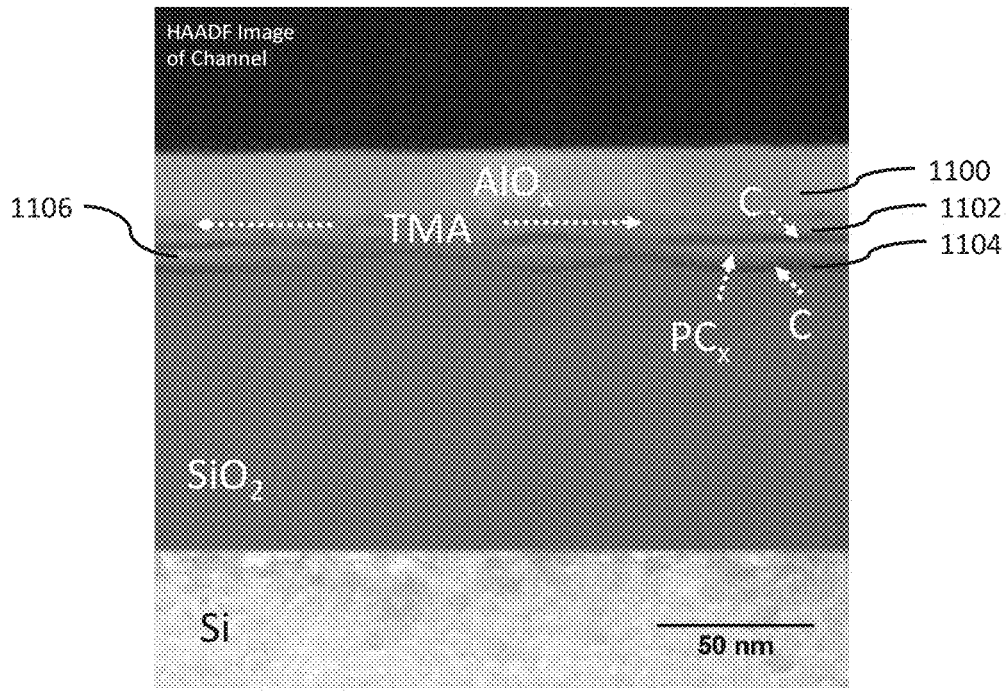
FIG. 11(a) shows a high-angle annular dark-field (HAADF) imaging of the b-PC channel of the p-FET according to an example embodiment.
Figure 11B:
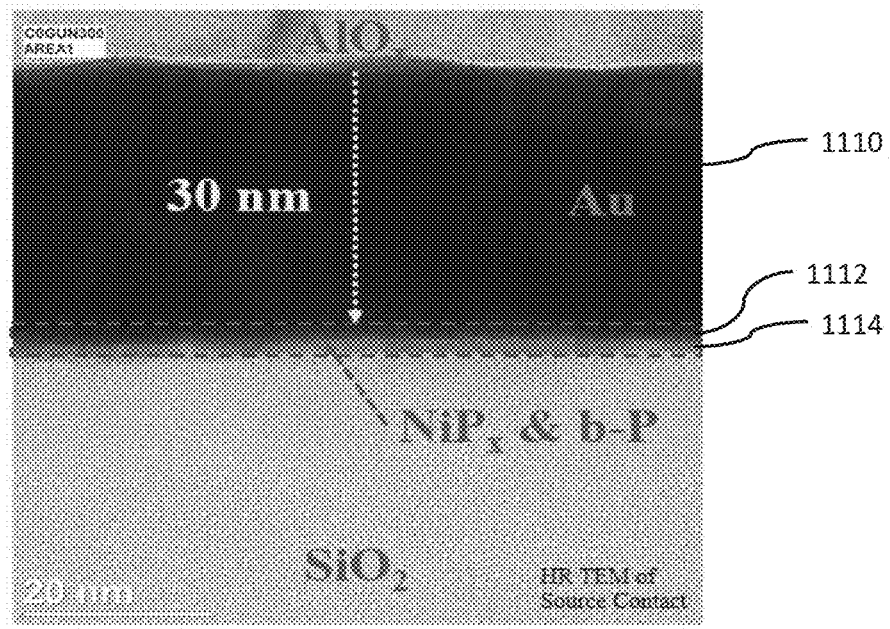
FIG. 11(b) shows a cross-sectional high resolution transmission electron microscope (HR-TEM) image of the metal contact at the source of the transistor according to an example embodiment.
Figure 11C:
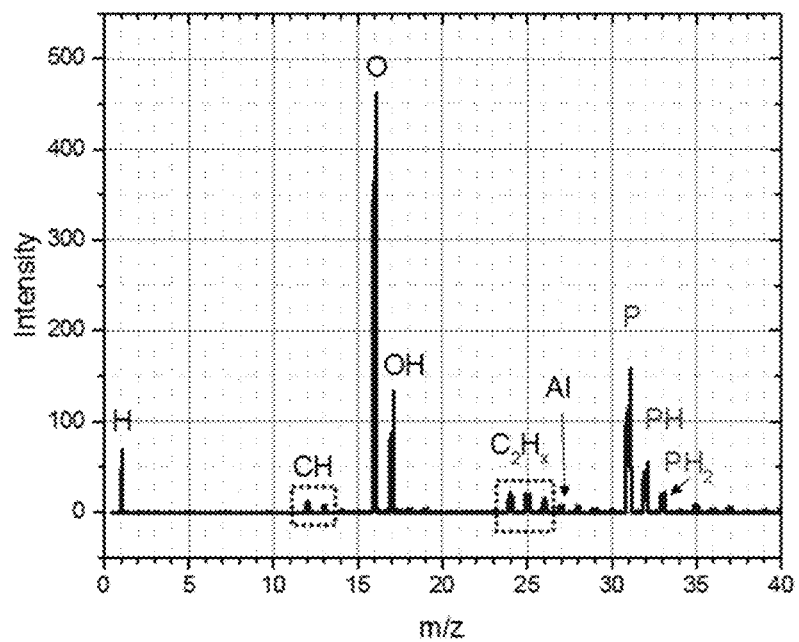
FIG. 11(c) shows a TOF-SIMS that shows the formation of phosphine (i.e. PHx) when displaced phosphorus atoms diffused into the thermally decomposed TMA layer and reacted with the hydrocarbons bonded to the Aluminum, according to an example embodiment.
Figure 11D:
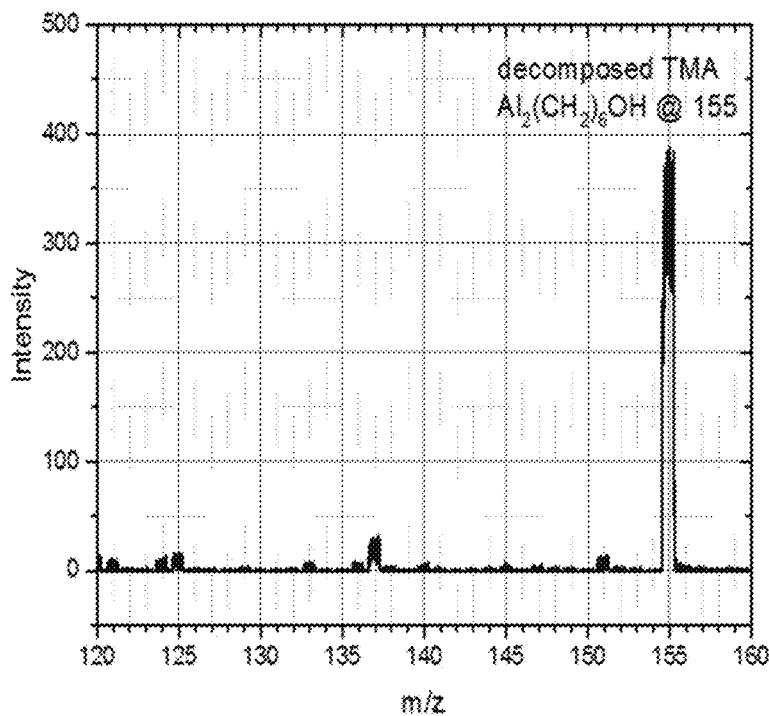
FIG. 11(d) shows a TOF-SIMS spectra that confirms the presence of the thermally decomposed TMA, $Al_2(CH_2)_6OH$, which is reported to form when TMA is heated to 200° C. according to an example embodiment.
Figure 11E:
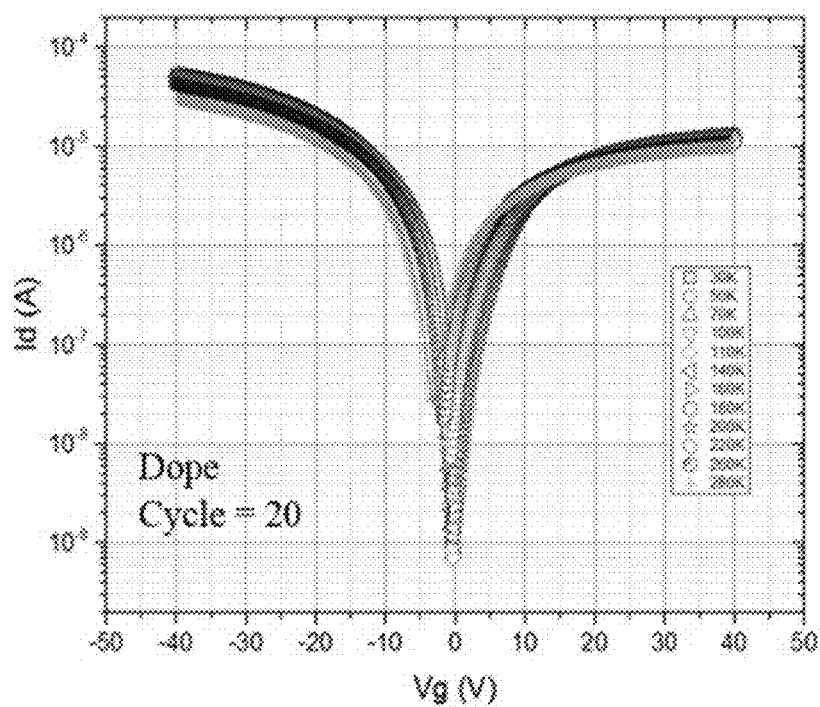
FIG. 11(e) shows the transfer characteristic, $I_d$-$V_g$ curves, of a 13 nm thick, 11 μm wide and 5 μm long b-PC p-FET according to an example embodiment measured at $V_d$=100 mV with different cryogenic temperatures ranging from 30 K to 280 K.

FIG. 10(a) shows a top view image of one of the b-PC p-FET according to an example embodiment fabricated on a Si/SiO$_2$ (90 nm) substrate taken by a scanning electron microscope (SEM). FIGS. 10(b) and (c) show the schematic layer diagram of the contact and the channel region, respectively, of a b-PC p-FET according to an example embodiment. FIG. 11(a) shows a high-angle annular dark-field (HAADF) imaging of the b-PC channel of the p-FET according to an example embodiment. From the image, one can see the location of the $Al_2O_3$ passivation layer 1100 (~23 nm), the thermally decomposed TMA layer 1102 (~4 nm), the carbon (i.e. the dark colored layers e.g. 1104) and the b-PC layers 1106 (~6 nm). Moreover, the b-PC layers 1106 seem to be sandwiched in between 2 layers of carbon (i.e. the dark colored layers e.g. 1104). These carbons will help to passivate any dangling bonds in the top and bottom interfaces of the transistor. FIG. 11(b) shows a cross-sectional high resolution transmission electron microscope (HR-TEM) image of the metal contact at the source of the transistor according to an example embodiment. It confirms the presence of the gold overlay, Au, 1110 (~30 nm), the Ni-alloy (NiP) 1112, and the b-PC layers 1114 (~6 nm) in the source/drain region of the p-FET. FIG. 11(c) shows a TOF-SIMS that shows the formation of phosphine (i.e. PHx) when displaced phosphorus atoms diffused into the thermally decomposed TMA layer and reacted with the hydrocarbons bonded to the Aluminum. FIG. 11(d) shows a TOF-SIMS spectra that confirms the presence of the thermally decomposed TMA, $Al_2(CH_2)_6OH$, which is reported to form when TMA is heated to 200° C.[17] This finding corroborates that in the material synthesis process according to an example embodiment the heating of TMA to about 200° C. causes one of the methyl groups in the TMA to react with a hydrogen on another methyl group, liberating methane $CH_4$. This leaves the $CH_2$ group bound to the aluminum as $Al_2(CH_2)_6OH$ and $CH_4$ to react with b-P, breaking the P—P bonds and reorganizing the b-P channel into b-PC channel. FIG. 11(e) shows the transfer characteristic, $I_d$-$V_g$ curves, of a 13 nm thick, 1 µm wide and 5 µm long b-PC p-FET according to an example embodiment measured at $V_d$=100 mV with different cryogenic temperatures ranging from 30 K to 280 K. The doping cycle of the device in this embodiment is 20. It shows an ambipolar behavior where both holes and electrons carriers can be induced in the device. The performance of a b-PC device according to an example embodiment was found be stable after 112 days.

Figure 12:
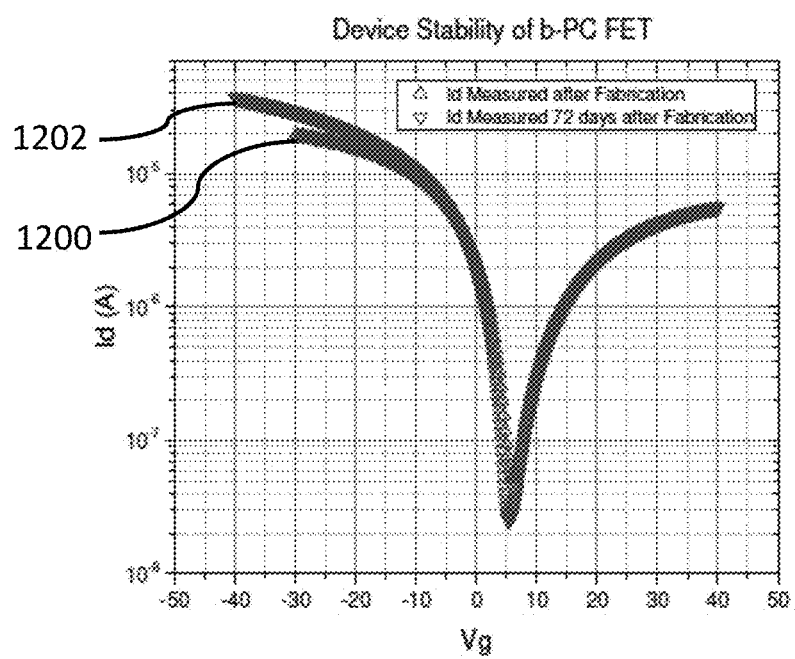
FIG. 12 shows the transfer characteristic, $I_d$-$V_g$ curves of the device according to an example embodiment, illustrating that the intrinsic mobility at room temperature remains stable over 72 days and stays around μ=1031±125 cm²/Vs.

FIG. 12 shows the transfer characteristic, $I_d$-$V_g$ curves of the device according to an example embodiment. The intrinsic mobility at room temperature (curve 1200) remains stable over 72 days (compare curve 1202) and stays around µ=1031±125 cm²/Vs. Additional calculations were performed to identify the dependence of the band gap on the concentration of carbon in b-PC according to example embodiments, which are listed in Table 1 below. It was found that there is no monotonic relationship of the band gap with the concentration of carbon, according to example embodiments.

TABLE 1

| Allotrope of b-PC | Band Gap (eV) |
| --- | --- |
| $PC_{0.5}$ | 1.128 |
| $PC_{0.67}$ | 0.447 |
| PC | 0.59 |
| $PC_{1.5}$ | 0.005 |
| $PC_3$ | 1.199 |

Figure 13A:
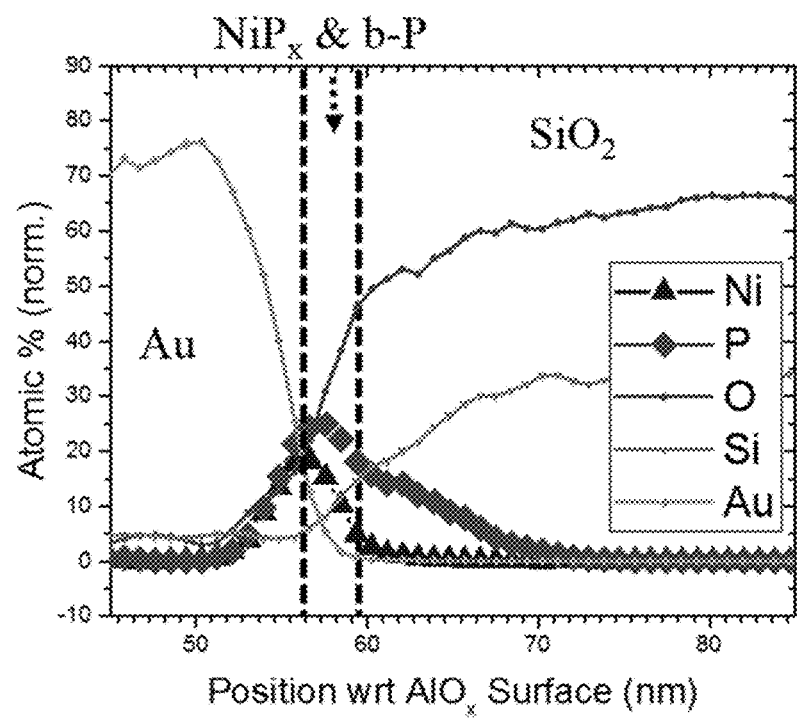
FIG. 13(a) shows the energy dispersive X-ray (EDX) spectroscopy analysis of the cross-section metal contact at the source of the transistor according to an example embodiment.
Figure 13B:
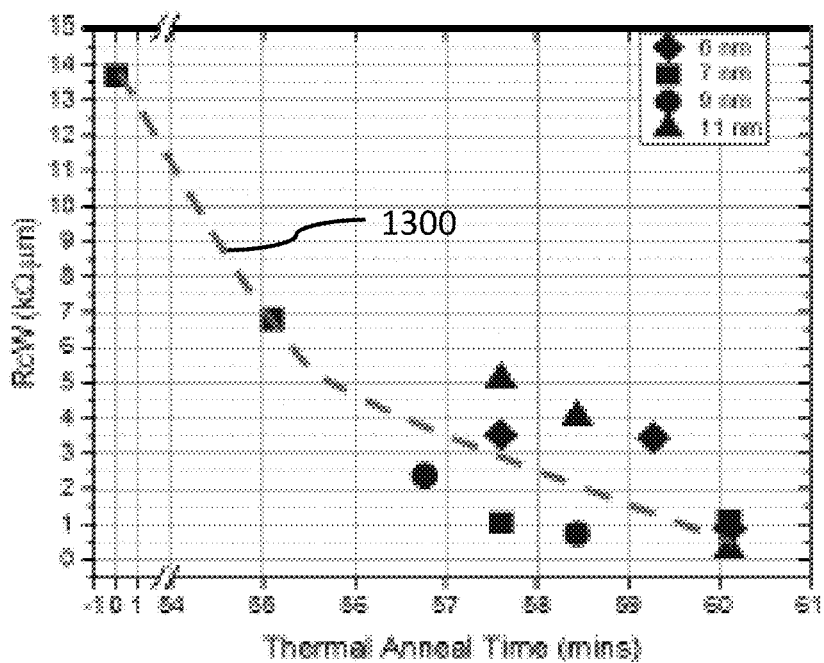
FIG. 13(b) shows the variation of the normalized contact resistance ($R_cW$) with the thermal annealing time according to example embodiments.
Figure 13C:
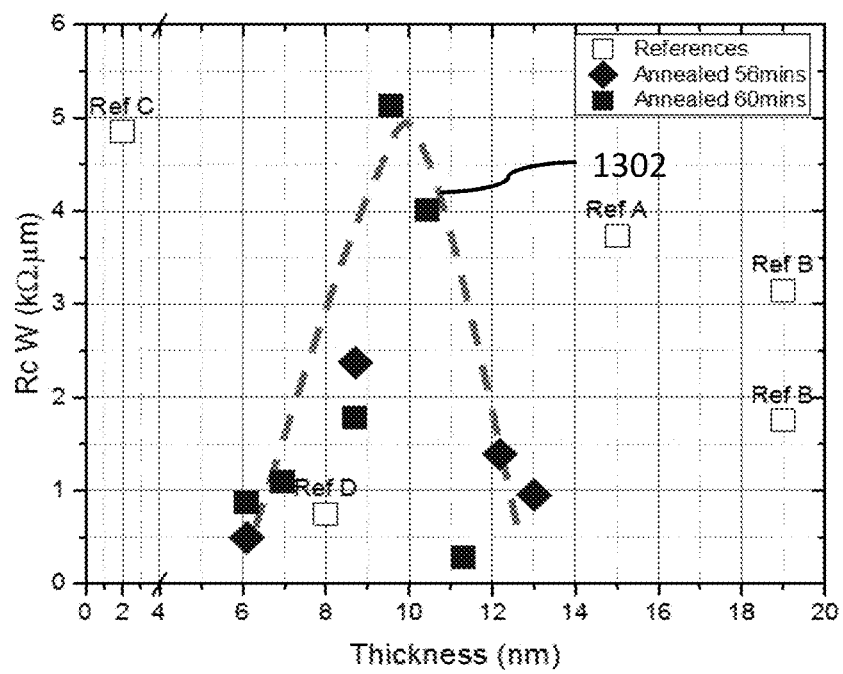
FIG. 13(c) shows the variation of the RcW with the thickness of the b-PC according to example embodiments.

FIG. 13(a) shows the energy dispersive X-ray (EDX) spectroscopy analysis of the cross-section metal contact at the source of the transistor according to an example embodiment. The total thickness of the b-P and the Ni-alloy is ~13 nm. The Au metal was sputtered to prevent the nickel from oxidation and to improve the contact with the probe station during measurement. By comparing the atomic concentration of phosphorus in the contact region of the transistor (~25%) to the channel region (~10%) as shown in FIG. 3(b) above, one can estimate the amount of phosphorus atoms (~15%) the original b-P in the channel region has lost to carbon atoms during doping according to an example embodiment. FIG. 13(b) shows the variation of the normalized contact resistance ($R_cW$) with the thermal annealing time according to example embodiments. A dashed line 1300 is drawn as a guide to the eye to show the monotonic decrease in RcW with anneal time according to example embodiments. FIG. 13(c) shows the variation of the RcW with the thickness of the b-PC according to example embodiments. A dashed line 1302 is drawn as a guide to the eye to show the non-monotonic variations in the RcW with thickness. The reference values in hollow squares are taken from Ref A[24], Ref B[25], Ref C[26], and Ref D[27].

Figure 14A:
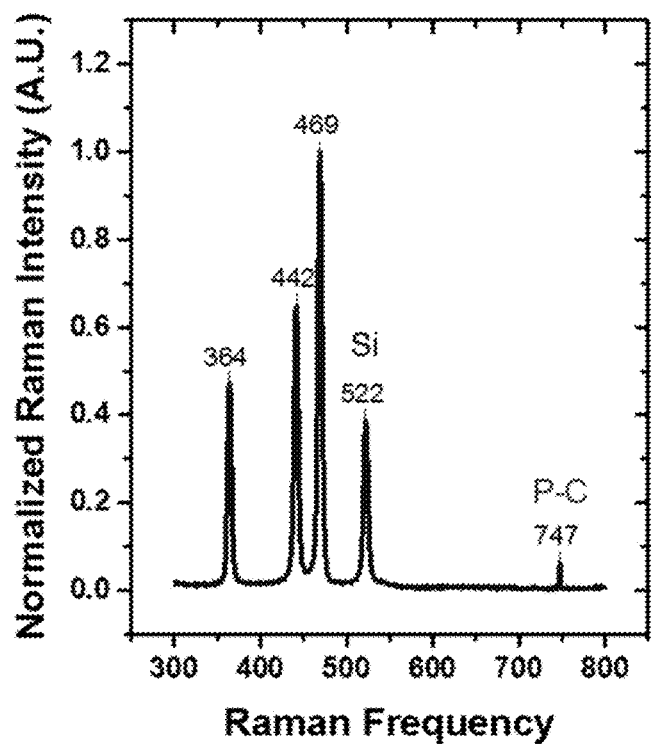
FIGS. 14(a) and (b) shows the Raman and XPS spectra, respectively, of the few layers b-PC for a b-PC phototransistor according to an example embodiment.
Figure 14B:
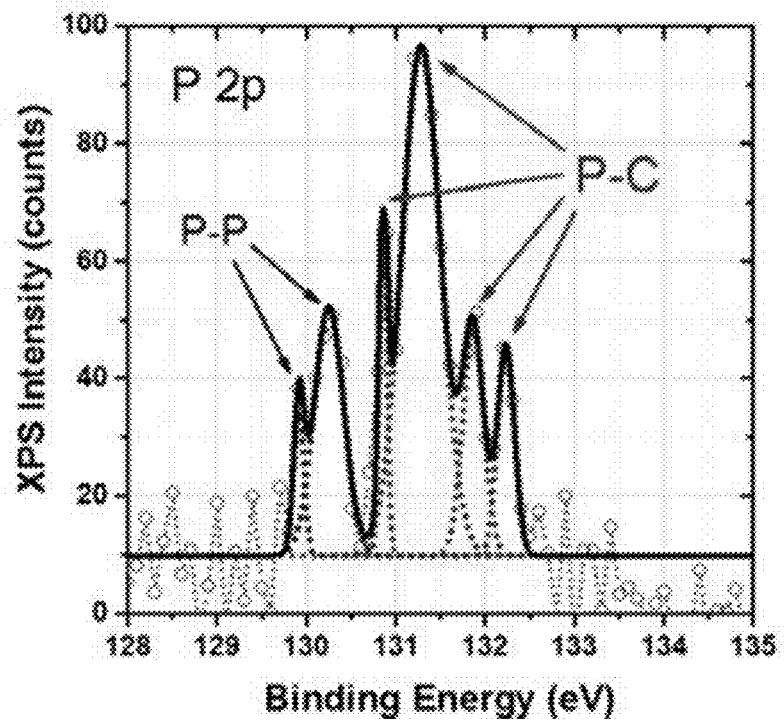
FIG. 14(c) shows the absorption spectra taken using a Fourier transform infrared spectroscopy (FTIR), of the few layers b-PC for a b-PC phototransistor according to an example embodiment.
Figure 14C:
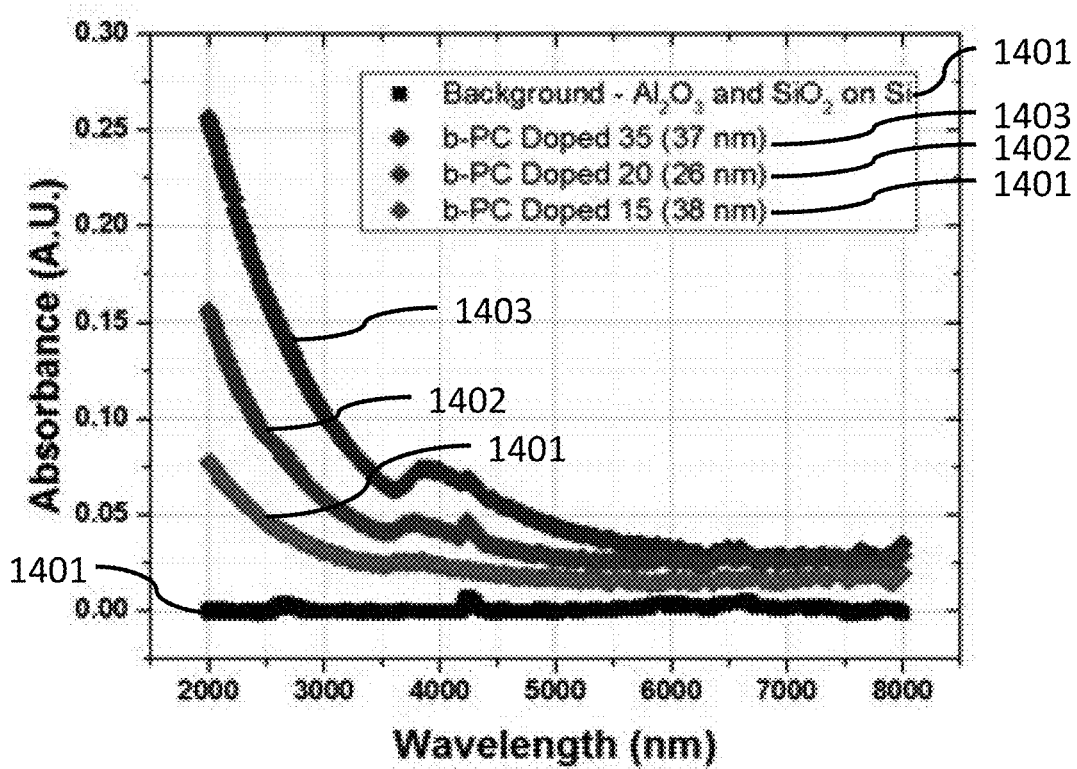

FIGS. 14(a) and (b) shows the Raman and XPS spectra, respectively, of the few layers b-PC for a b-PC phototransistor according to an example embodiment. In the Raman spectra of the b-PC in FIG. 14(a), the sample possesses a prominent b-PC phonon mode at 747 $cm^{-1}$ in addition to the three phonon modes of b-P at 364 $cm^{-1}$, 442 $cm^{-1}$, and 469 $cm^{-1}$. The P—C bond stretching modes (670-780 $cm^{-1}$), are based on theoretical calculations reported in the literature[1,2]. In the XPS spectra of the P 2p core level in b-PC in FIG. 14(b), the binding energies at 130.9 eV, 131.3 eV, 131.9 eV, 132.2 eV and 132.1 eV can all be assigned to the P—C bonds[3,4]. The b-PC also exhibits the spin-orbit split doublet of an exfoliated b-P at ~129.9 eV and 130.2 eV[5]. The absorption spectra taken using a Fourier transform infrared spectroscopy (FTIR) are shown in FIG. 14(c). The spectra display the absorbance measured as a function of wavelengths for b-PC for b-PC phototransistors according to example embodiments, with different thicknesses and doping cycles, the latter increasing from curve 1401 to 1403. A background spectrum for the $Al_2O_3$ and $SiO_2$ on Si is also shown, curve 1404. The spectral absorbance of the b-PC according to example embodiments provides a hint on the potential range of wavelengths in the electromagnetic spectra the b-PC phototransistor is able to detect.

Figure 15A:
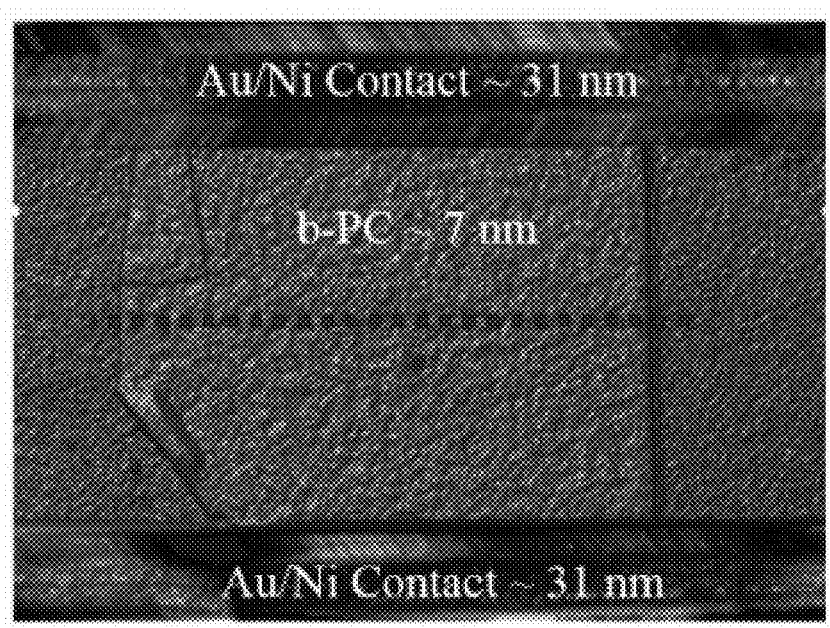
FIGS. 15(a) and (b) show the Atomic Force Microscopy (AFM) image of one of the fabricated devices according to an example embodiment and the average thickness measured by the AFM (~7 nm), respectively.
Figure 15B:
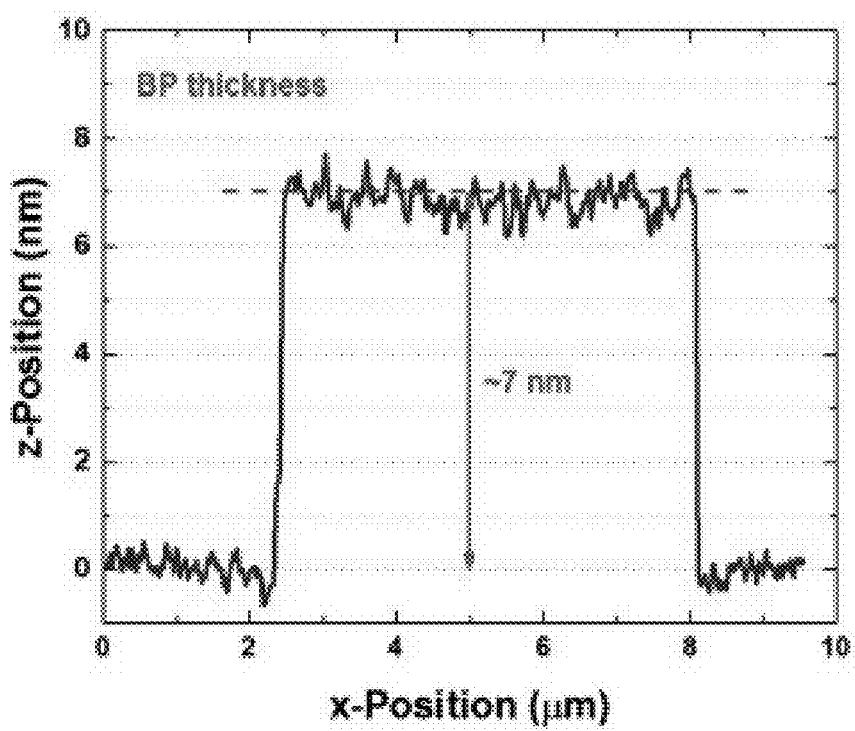
FIGS. 15(c) and (d) show, respectively, the transfer characteristic, $I_d$-$V_g$ curves, and the output characteristic, $I_d$-$V_d$ curves, of one of the fabricated devices according to an example embodiment measured at room temperature.
Figure 15C:
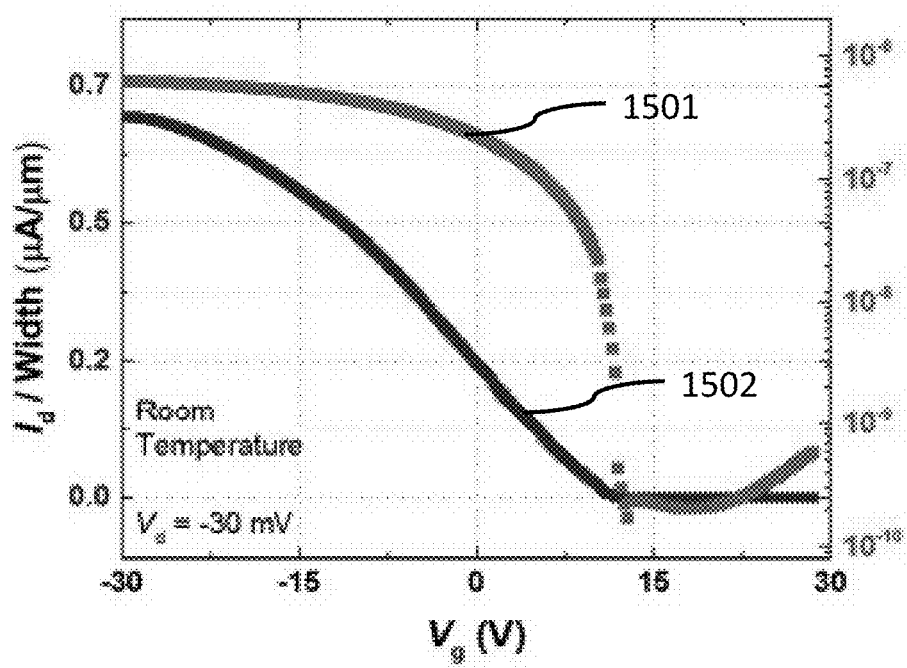
Figure 15D:
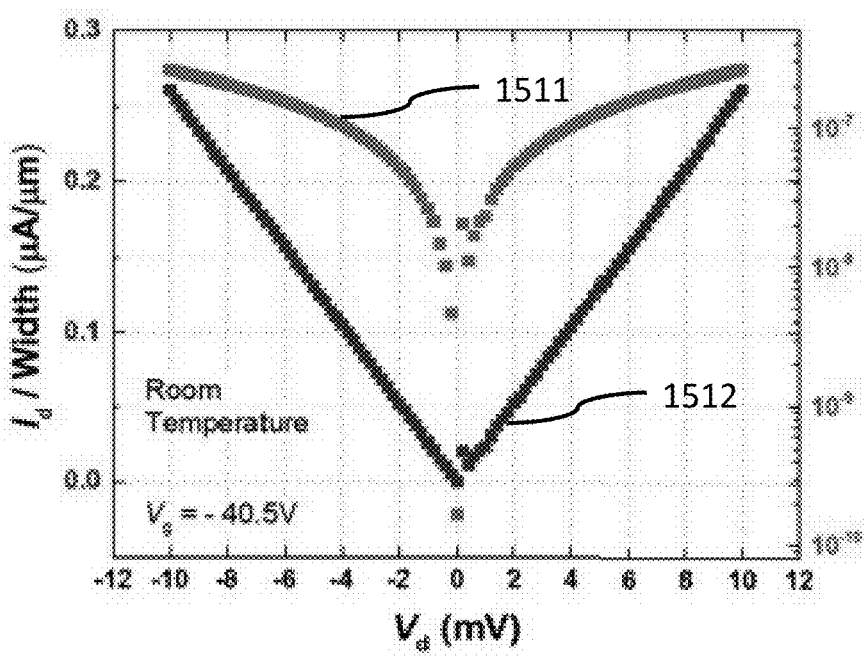

To study the electrical performance of the two terminals b-PC p-FET with a bottom gate, measurements were performed on a probe station at room temperature under ambient condition. FIGS. 15(a) and (b) show the Atomic Force Microscopy (AFM) image of one of the fabricated devices according to an example embodiment and the average thickness measured by the AFM (~7 nm), respectively. FIGS. 15(c) and (d) are respectively the transfer characteristic, $I_d$-$V_g$ curves, and the output characteristic, $I_d$-$V_d$ curves, measured at room temperature and printed at linear (curves 1501, 1511) and log (curve 1502, 1512) scales. While the linear $I_d$-Vd characteristics in the FIG. 15(d) implies a high-quality Ohmic-like contact have been formed between the metal electrodes and b-PC channel, the transfer characteristic in FIG. 15(c) allows one to extract its intrinsic or peak field effect (FE) mobility and contact resistance. By physically sputtering the channel to create an edge contact interface and thermally treating the Ni contact into NiP-alloy contact on the b-PC p-FET according to an example embodiment, as described above, the contact resistance of these Ohmic-like contacts was advantageously reduced to 289 Ω-µm.

Figure 16A:
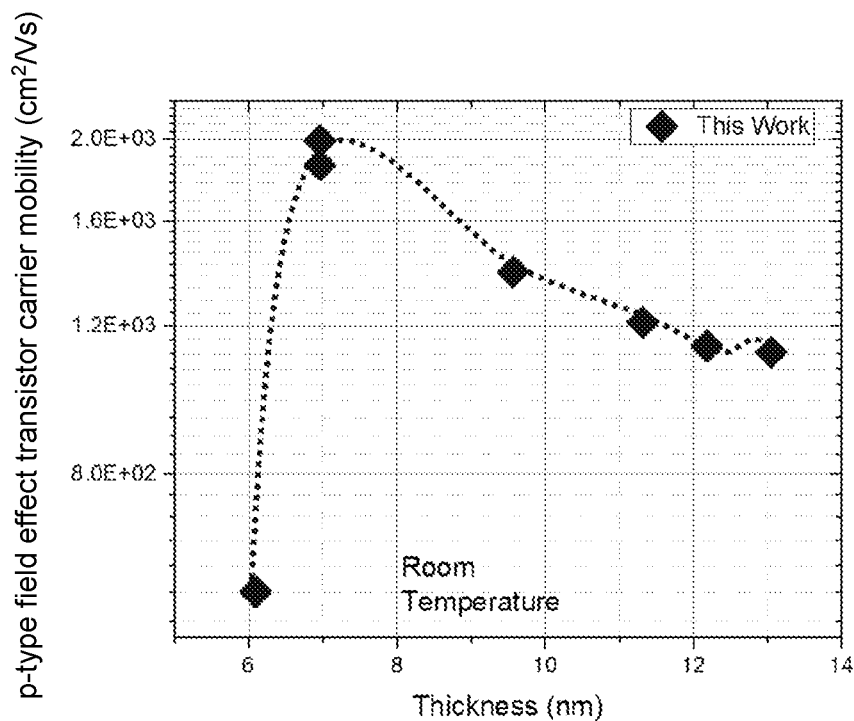
FIG. 16(a) shows the non-monotonic variation of the calculated peak p-type field effect transistor carrier mobility with the channel thickness of transistor, according to example embodiments.

FIG. 16(a) shows the non-monotonic variation of the calculated peak D-type field effect transistor carrier mobility with the channel thickness of transistor, according to example embodiments. It is believed that the non-monotonic variation with the thickness is mainly due to two competing phenomena. First, the charge impurity at the b-PC/SiO$_2$ interface, which causes mobility to increase with thickness as the influence of the charge impurities at the b-PC/SiO$_2$ interface diminishes with thickness. This would explain the initial sharp increase in the field-effect mobility as the thickness increase from ~6 nm to 16 nm. Second, the charge screening from induced carriers and the finite interlayer resistance of the b-PC, which causes the current to decrease with thickness for a device configured as a bottom gated transistor. The screening effect can be understand as any induced carriers travelling in the channel would also inevitable acts as a screen and cancel out any electric field emanating from the bottom from inducing more free carriers in the upper layers of the channel. The effect of the finite interlayer resistance of the b-PC FET according to example embodiments is subtler as it forces majority of the current, which is injected from the top surface of the channel, to flow in the upper layers of the channel. It indirectly amplifies the screening effect by subjecting more carriers to the upper layers of the b-PC which is experiencing less electric field due to screening from the induced carriers. Therefore, as the samples become thicker from ~8 nm, more of their currents is being screened and thus the overall p-type field effect transistor carrier mobility would decrease. By using a top gated device structure with a layer of high-k dielectric material in a different example embodiment, one could effectively screen the charge impurities at the interface and remove the influence of the interlayer resistance and charge screening of induced carrier on the carrier mobility.

Figure 16B:
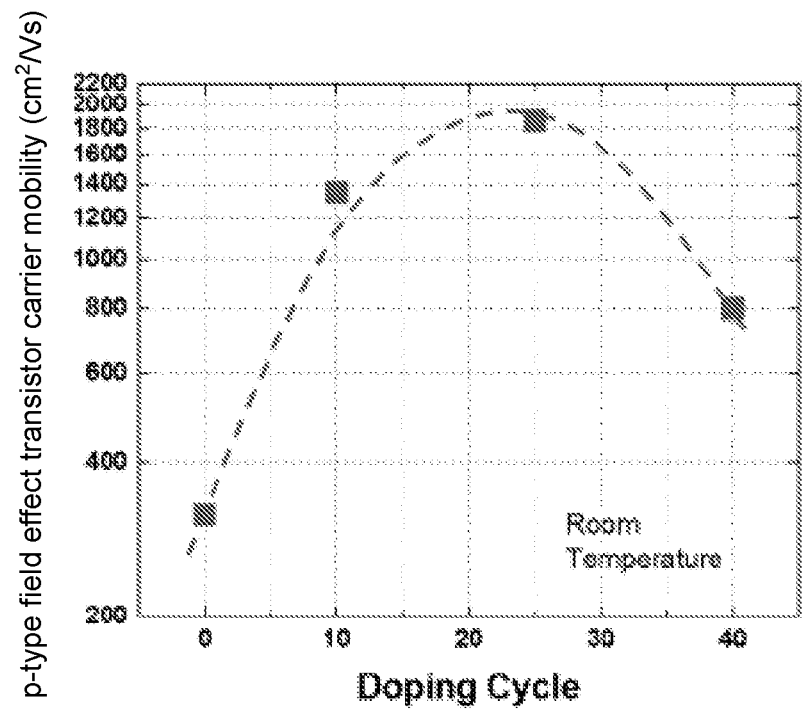
FIG. 16(b) displays the changes of the p-type field effect transistor carrier mobility with the number of doping cycles, according to example embodiments.

FIG. 16(b) displays the changes of the p-type field effect transistor carrier mobility with the number of doping cycles, according to example embodiments. Such a variation with doping cycles can be expected as different doping cycles would result in a b-PC with a different stoichiometric composition due to a change in the atomic concentration ratio of P to C. Since each allotrope of b-PC would have a different effective mass, its carrier mobility would thus change with doping cycles. FIG. 16(b) shows the optimum doping cycle for a 7 nm thick and 5 μm long b-P channel is 25 cycles.

Figure 16C:
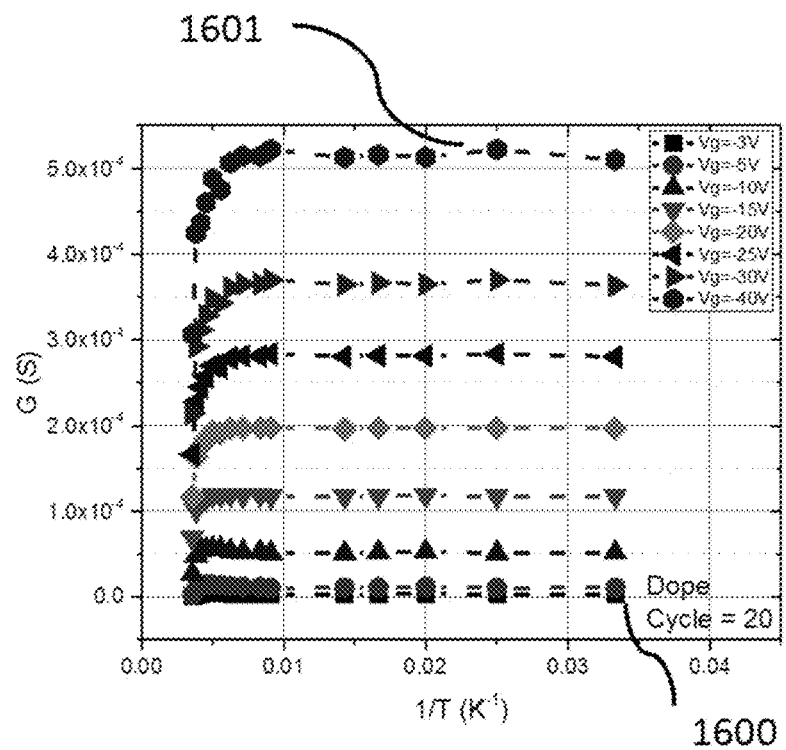
FIG. 16(c) shows a conductivity which is semi-metallic at all gating voltages, according to an example embodiment.
Figure 16D:
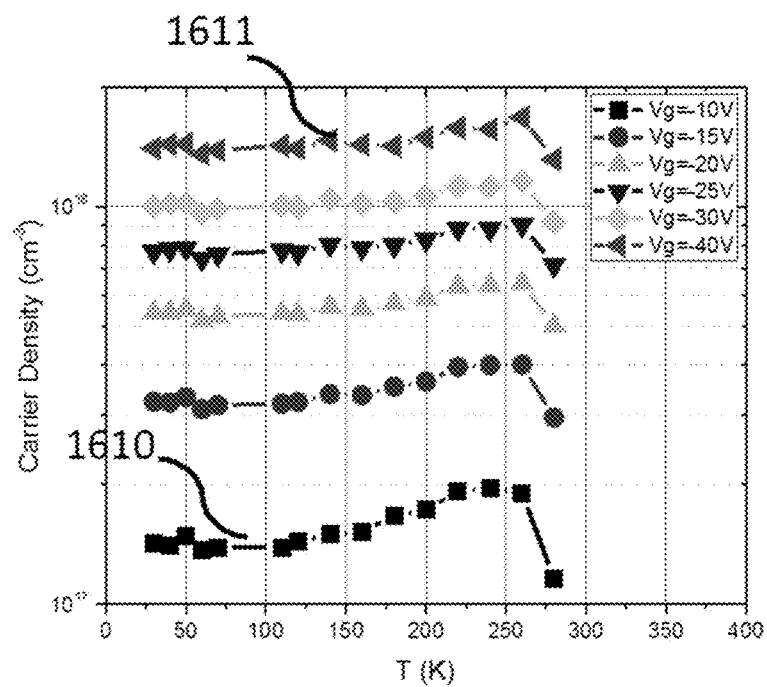
FIG. 16(d) shows the hole carrier density increasing with the gate voltage and before reaching a high carrier density of ~$10^{18}$ cm$^{-3}$ (or a carrier concentration of ~$10^{14}$ cm$^{-2}$) at $V_G$=−40V, according to an example embodiment.

FIG. 16(c) shows a conductivity which is semi-metallic at all gating voltages, increasing from –3 V (curve 1600), to –40 V (curve 1601), according to an example embodiment. This is in contrast from a b-P p-FET, where the conductivity for all gating voltages would increase with initial increases in temperature above 2 K before turning around at ~100 K to 180 K (depending on the gating voltages) and start to decrease[28]. Such a semi-metallic behavior is predicted by DFT calculation to exist in one of the allotrope of b-PC[29][30]. As can be seen from FIG. 16(d), the hole carrier density increases with the gate voltage, increasing from –10 V (curve 1610) and before reaching a high carrier density of ~1018 cm$^{-3}$ (or a carrier concentration of ~1014 cm$^{-2}$) at Vg=–40V, curve 1611. A carrier concentration above $10^{13}$ cm$^{-2}$ would imply that two-phonon scattering is negligible and scattering should mostly come from single-phonon scattering with optical phonons[31].

Figure 16E:
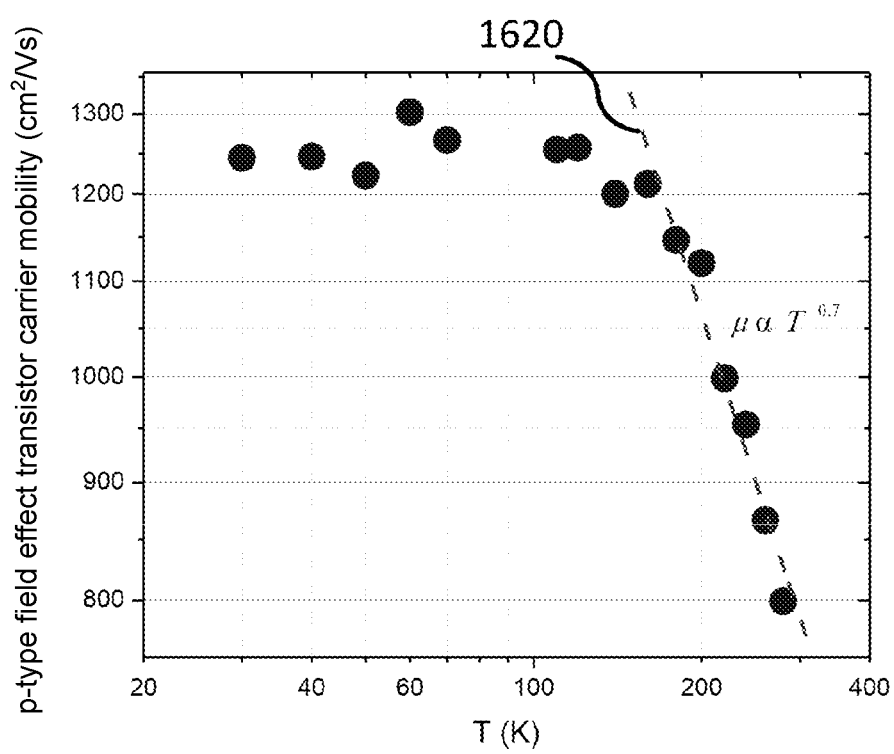
FIG. 16(e) shows the dependency of p-type field effect transistor carrier mobility on the operating temperature (T), according to an example embodiment.

The dependency of p-type field effect transistor carrier mobility on the operating temperature (T) is described in FIG. 16(e), according to an example embodiment. At T>100 K, the p-type field effect transistor carrier mobility decreases with increasing temperature and follows an electron-phonon scattering limited transport mechanism. This mechanism has a power law dependence in the form of $$\mu \sim T^{-\gamma},$$

where the exponent γ depends on the dominant phonon scattering mechanism. A γ value of ~0.7 was extracted from the linear fit (curve 1620) to this part of the curve and the small γ values imply that optical phonon is the dominating scattering event over the scattering of acoustic phonon and residual impurities in this temperature regime. This value is around the value of a homogenous b-P p-FET[28] (~0.5) but is smaller than a heterostructure b-P p-FET[32] (~2.0) encapsulated with h-BN in vacuum. At T<100 K, disorder scattering dominates over the phonon scattering and limits the p-type field effect transistor carrier mobility to around ~1250 cm$^2$V$^{-1}$s$^{-1}$. The disorder potential is most likely generated by residual charged impurities either at the top surface of the b-PC, e.g. Al adatoms, or at the substrate interface, e.g. dangling P or C bonds, and can be improved with interface engineering in different embodiments[32].

In summary, example embodiments of the present invention can provide high performance few-layer PC p-FETs via a novel carbon doping technique which achieved a high mobility of 1995 cm$^2$V$^{-1}$s$^{-1}$ at room temperature. EDX profile data revealed a b-PC channel full of carbon being formed in example embodiments, while Raman and XPS established the P—C bonds that these carbons formed with phosphorus, and TOF-SIMs confirmed the presence of the allotropes of phosphorus carbide predicted by theoretical calculations.

In example embodiments, carbon doping can advantageously be performed via layer-by-layer deposition using a conventional tool (e.g. by atomic layer deposition technique). A layer-by-layer deposition technique can have the benefits of good conformity to the underlying surface and is desirable for many applications such as in the fabrication of nanometer-scaled devices.

For example, the use of a conventional tool for the carbon doping ensure the process will be compatible to complimentary metal-oxide-semiconductor (CMOS) process technology in use in the industry today and lower the entry barrier for future integration with CMOS technologies during mass production or scaling.

Also, in example embodiments the device parameters can advantageously be controlled by the carbon doping process parameters. This allows the optimization and customization of devices' parameters e.g. carrier mobility and band gap via pulsing duration, pulsing cycle, and temperature.

High performance few-layer PC p-FETs were demonstrated according to example embodiments via a carbon doping technique which achieved a high mobility of 1995 cm$^2$V$^{-1}$s$^{-1}$ at room temperature. First-principles calculations predict a stable b-PC with an effective mass for hole and electron carriers that are lighter than b-P in the armchair direction. EDX profile reveal a b-PC channel full of carbon, Raman and XPS established the P—C bonds that these carbons formed with phosphorus, and TOF-SIMs confirms the presence of the allotropes of phosphorus carbide predicted by theoretical calculations. Additionally, a low contact resistance of 289 Ω-μm was achieved via a NiP alloy contact with an edge contacted metal/PC interface at the source/drain made possible by sputtering and thermal treatment, according to an example embodiment.

In one embodiment, a crystalline material comprising a plurality of stacked two-dimensional black phosphorous carbide layers is provided.

Vertically adjacent ones of the stacked two-dimensional black phosphorous carbide layers may be adhered to each other by van-der-Waals forces.

The crystalline material may exhibit an absorption spectrum that extends to about 8,000 nm or longer wavelength.

The crystalline material may exhibiting an absorption spectrum that extends from about 2,000 nm or lower wavelength.

In one embodiment, a phototransistor comprising the crystalline material of the above embodiment is provided.

A b-PC phototransistor can be provided according to example embodiments with a wide absorption spectrum till 8,000 nm and a tunable responsivity and response time at an excitation wavelength of 2,004 nm. The b-PC phototransistor according to example embodiments can be tuned to operate with a peak responsivity of ~2,163 A/W for low light condition or with a minimum response time of ~0.7 ns for high speed applications. Its $NEP_{shot}$~1.3 $fW/Hz^{1/2}$ indicates infrared radiation in the femto-watt range can be detected above the shot noise level of this phototransistor. The wide intrinsic absorption spectrum and operating versatility demonstrated in the b-PC phototransistor according to example embodiments makes b-PC a very attractive material for many applications such as use as a sensor in flexible optoelectronics in the internet-of-things (IoT).

The phototransistor may exhibit a tunable responsivity and response time at a fixed excitation wavelength. The phototransistor may exhibiting a peak responsivity of more than 2,000 A/W at an excitation wavelength of about 2,000 nm. The phototransistor may exhibit a minimum response time of about 0.7 ns at an excitation wavelength of about 2,000 nm.

The crystalline material may form a channel between electrodes of the phototransistor. The electrodes may comprise an edge-contacted interface to the channel.

In one embodiment, a method of forming the crystalline structure of the above embodiment or the phototransistor of the above embodiment is provided, comprising repeated pulsing and purging of an organometallic precursor for doping a black phosphorus with carbons.

The repeated pulsing and purging of the organometallic precursor may be performed under substantially anaerobic and anhydrous conditions.

The purging may be performed with nitrogen.

The organometallic material may be an alkylmetallic compound, preferably the alkylmetallic compound is an alkylaluminum compound, and most preferably the alkylaluminum compound is a dimer of trimethylaluminum (Al2 (CH3)6).

The method may comprise deposition of the black phosphorus onto a surface of a substrate, the substrate having a pre-grown thermal oxide at the surface. The substrate may comprise Silicon or Sapphire.

The method may further comprise growing a passivation layer on the crystalline material. The passivation layer may be grown at the same time as performing a thermal treatment for the doping of the black phosphorus with carbons. Growing the passivation layer may comprise pulsing and purging the organometallic precursor. The pulsing and purging the organometallic precursor for growing the passivation layer may be performed under hydrous conditions.

The black phosphorus may be exfoliated from a bulk single crystal.

The doping of the black phosphorous may be performed in an atomic layer deposition chamber.

The above description of illustrated embodiments of the systems and methods is not intended to be exhaustive or to limit the systems and methods to the precise forms disclosed. While specific embodiments of, and examples for, the systems components and methods are described herein for illustrative purposes, various equivalent modifications are possible within the scope of the systems, components and methods, as those skilled in the relevant art will recognize. The teachings of the systems and methods provided herein can be applied to other processing systems and methods, not only for the systems and methods described above.

The elements and acts of the various embodiments described above can be combined to provide further embodiments. These and other changes can be made to the systems and methods in light of the above detailed description.

In general, in the following claims, the terms used should not be construed to limit the systems and methods to the specific embodiments disclosed in the specification and the claims, but should be construed to include all processing systems that operate under the claims. Accordingly, the systems and methods are not limited by the disclosure, but instead the scope of the systems and methods is to be determined entirely by the claims.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

REFERENCES

[1] J. Sun, G. Zheng, H.-W. Lee, N. Liu, H. Wang, H. Yao, W. Yang, Y. Cui, Nano Letters 2014, 14, 4573.

[2] F. Claeyssens, G. M. Fuge, N. L. Allan, P. W. May, M. N. R. Ashfold, Dalton Transactions 2004, 3085.

[3] Y. Wen, B. Wang, C. Huang, L. Wang, D. Hulicova-Jurcakova, Chemistry—A European Journal 2015, 21, 80; S. Some, J. Kim, K. Lee, A. Kulkami, Y. Yoon, S. Lee, T. Kim, H. Lee, Advanced Materials 2012, 24, 5481.

[4] C. R. Ryder, J. D. Wood, S. A. Wells, Y. Yang, D. Jariwala, T. J. Marks, G. C. Schatz, M. C. Hersam, Nat Chem 2016, 8, 597.

[5] N. B. Goodman, L. Ley, D. W. Bullett, Physical Review B 1983, 27, 7440.

[6] G. Wang, R. Pandey, S. P. Karna, Nanoscale 2016, 8, 8819; J. Guan, D. Liu, Z. Zhu, D. Tománek, Nano Letters 2016, 16, 3247.

[7] J. D. Wood, S. A. Wells, D. Jariwala, K.-S. Chen, E. Cho, V. K. Sangwan, X. Liu, L. J. Lauhon, T. J. Marks, M. C. Hersam, Nano Letters 2014, 14, 6964.

[8] C. Soci, A. Zhang, B. Xiang, S. A. Dayeh, D. P. R. Aplin, J. Park, X. Y. Bao, Y. H. Lo, D. Wang, Nano Lett. 2007, 7, 1003.

[9] G. Kresse, J. Furthmüller, Physical Review B 1996, 54, 11169.

[10] G. Wang, R. Pandey, S. P. Karna, Nanoscale 2016, 8, 8819.

[11] J. Guan, D. Liu, Z. Zhu, D. Tománek, Nano Letters 2016, 16, 3247.

[12] W. C. Tan, Y. Cai, R. J. Ng, L. Huang, X. Feng, G. Zhang, Y.-W. Zhang, C. A. Nijhuis, X. Liu, K.-W. Ang, Adv. Mater. 2017, 29, 1700503.
[13] a) G. Wang, R. Pandey, S. P. Karna, Nanoscale 2016, 8, 8819; b) J. Guan, D. Liu, Z. Zhu, D. Tománek, Nano Lett. 2016, 16, 3247.
[14] J. A. Hornbeck, J. R. Haynes, Phys. Rev. 1955, 97, 311.
[15] K. K. Hamamatsu, "Si Photodiodes," (Ed: Hamamatsu-Photonics), 2017.
[16] K. K. Hamamatsu, "InGaAs Photodiodes," (Ed: Hamamatsu-Photonics) 2015.
[17] M. Buscema, J. O. Island, D. J. Groenendijk, S. I. Blanter, G. A. Steele, H. S. van der Zant, A. Castellanos-Gomez, Chem. Soc. Rev. 2015, 44, 3691.
[18] M. Long, A. Gao, P. Wang, H. Xia, C. Ott, C. Pan, Y. Fu, E. Liu, X. Chen, W. Lu, T. Nilges, J. Xu, X. Wang, W. Hu, F. Miao, Sci. Adv. 2017, 3, e1700589.
[19] G. Konstantatos, M. Badioli, L. Gaudreau, J. Osmond, M. Bernechea, F. P. G. de Arquer, F. Gatti, F. H. L. Koppens, Nat. Nanotechnol. 2012, 7, 363.
[20] A. A. Balandin, Nat. Nanotechnol. 2013, 8, 549.
[21] Q. Guo, A. Pospischil, M. Bhuiyan, H. Jiang, H. Tian, D. Farmer, B. Deng, C. Li, S. J. Han, H. Wang, Q. Xia, T. P. Ma, T. Mueller, F. Xia, Nano Lett. 2016, 16, 4648.
[22] C.-H. Liu, Y.-C. Chang, T. B. Norris, Z. Zhong, Nat. Nanotechnol. 2014, 9, 273.
[23] C. Soci, A. Zhang, B. Xiang, S. A. Dayeh, D. P. R. Aplin, J. Park, X. Y. Bao, Y. H. Lo, D. Wang, Nano Lett. 2007, 7, 1003.
[24] Z.-P. Ling, S. Sakar, S. Mathew, J.-T. Zhu, K. Gopinadhan, T. Venkatesan, K.-W. Ang, Scientific Reports 2015, 5, 18000.
[25] Y. Du, H. Liu, Y. Deng, P. D. Ye, ACS Nano 2014, 8, 10035.
[26] S. Das, M. Demarteau, A. Roelofs, ACS Nano 2014, 8, 11730.
[27] Y. Du, L. Yang, H. Zhou, P. D. Ye, IEEE Electron Device Letters 2016, 37, 429.
[28] L. Li, Y. Yu, G. J. Ye, Q. Ge, X. Ou, H. Wu, D. Feng, X. H. Chen, Y. Zhang, Nat Nano 2014, 9, 372.
[29] G. Wang, R. Pandey, S. P. Kama, Nanoscale 2016, 8, 8819.
[30] J. Guan, D. Liu, Z. Zhu, D. Tománek, Nano Letters 2016, 16, 3247.
[31] A. N. Rudenko, S. Brener, M. I. Katsnelson, Physical Review Letters 2016, 116, 246401.
[32] G. Long, D. Maryenko, J. Shen, S. Xu, J. Hou, Z. Wu, W. K. Wong, T. Han, J. Lin, Y. Cai, R. Lortz, N. Wang, Nano Letters 2016.

The invention claimed is:

1. A crystalline material comprising a plurality of stacked two-dimensional black phosphorous carbide layers exhibiting a p-type field effect transistor carrier mobility measured under room temperature and ambient pressure on a $SiO_2$/Si substrate of at least 1000 $cm^2$ $V^{-1}$ $s^{-1}$.

2. The crystalline material of claim 1, wherein vertically adjacent ones of the stacked two-dimensional black phosphorous carbide layers are adhered to each other by van-der-Waals forces.

3. The crystalline material of claim 1, exhibiting an absorption spectrum that extends to about 8,000 nm or longer wavelength.

4. The crystalline material of claim 1, exhibiting an absorption spectrum that extends from about 2,000 nm or lower wavelength.

5. A phototransistor comprising the crystalline material of claim 1.

6. The phototransistor of claim 5, exhibiting a tunable responsivity and response time at a fixed excitation wavelength.

7. The phototransistor of claim 6, exhibiting a peak responsivity of more than 2,000 A/W at an excitation wavelength of about 2,000 nm.

8. The phototransistor of claim 6, exhibiting a minimum response time of about 0.7 ns at an excitation wavelength of about 2,000 nm.

9. The phototransistor of claim 5, wherein the crystalline material forms a channel between electrodes of the phototransistor.

10. The phototransistor of claim 9, wherein the electrodes comprise an edge-contacted interface to the channel.

11. A method of forming the crystalline structure of claim 1 or the phototransistor of claim 5, comprising repeated pulsing and purging of an organometallic precursor for doping a black phosphorus with carbons.

12. The method of claim 11, wherein the repeated pulsing and purging of the organometallic precursor is performed under substantially anaerobic and anhydrous conditions.

13. The method of claim 11, wherein the purging is performed with nitrogen.

14. The method of claim 11, wherein organometallic material is an alkylmetallic compound, preferably the alkylmetallic compound is an alkylaluminum compound, and most preferably the alkylaluminum compound is a dimer of trimethylaluminum ($Al_2(CH_3)_6$).

15. The method of claim 11, comprising deposition of the black phosphorus onto a surface of a substrate, the substrate having a pre-grown thermal oxide at the surface.

16. The method of claim 11, further comprising growing a passivation layer on the crystalline material.

17. The method of claim 16, wherein the passivation layer is grown at the same time as performing a thermal treatment for the doping of the black phosphorus with carbons or wherein growing the passivation layer comprises pulsing and purging the organometallic precursor.

18. The method of claim 11, wherein the pulsing and purging the organometallic precursor for growing the passivation layer is performed under hydrous conditions.

19. The method of claim 11, wherein the black phosphorus is exfoliated from a bulk single crystal or wherein the doping of the black phosphorous is performed in an atomic layer deposition chamber.

20. The crystalline material of claim 1, exhibiting P—C Raman peaks in a frequency range from about 625 $cm^{-1}$ to 800 $cm^{-1}$.

* * * * *